United States Patent
Chidurala et al.

(10) Patent No.: US 11,228,287 B2
(45) Date of Patent: Jan. 18, 2022

(54) MULTI-STAGE DECOUPLING NETWORKS INTEGRATED WITH ON-PACKAGE IMPEDANCE MATCHING NETWORKS FOR RF POWER AMPLIFIERS

(71) Applicant: Cree, Inc., Durham, NC (US)

(72) Inventors: Madhu Chidurala, Los Altos, CA (US); Marvin Marbell, Morgan Hill, CA (US); Niklas Thulin, Ekero (SE)

(73) Assignee: Cree, Inc., Durham, NC (US)

( * ) Notice: Subject to any disclaimer, the term of this patent is extended or adjusted under 35 U.S.C. 154(b) by 9 days.

(21) Appl. No.: 16/903,771

(22) Filed: Jun. 17, 2020

(65) Prior Publication Data

US 2021/0399692 A1   Dec. 23, 2021

(51) Int. Cl.
*H03F 3/191* (2006.01)
*H03F 1/56* (2006.01)
*H03F 1/02* (2006.01)
*H03F 3/24* (2006.01)
*H03F 3/195* (2006.01)

(52) U.S. Cl.
CPC .......... *H03F 1/565* (2013.01); *H03F 1/0288* (2013.01); *H03F 3/195* (2013.01); *H03F 3/245* (2013.01); *H03F 2200/451* (2013.01); *H03F 2200/555* (2013.01)

(58) Field of Classification Search
CPC ..................................................... H03F 3/191
USPC .............................................. 330/302, 286
See application file for complete search history.

(56) References Cited

U.S. PATENT DOCUMENTS

| 4,042,887 A * | 8/1977 | Mead ...................... H03F 1/345 330/53 |
| 4,875,019 A * | 10/1989 | Monson .................. H03F 1/565 330/302 |
| 8,299,856 B2 * | 10/2012 | Blair ...................... H01L 23/66 330/302 |

(Continued)

FOREIGN PATENT DOCUMENTS

CN   107547050 A   1/2018

OTHER PUBLICATIONS

Camarchia, V. et al., "7 GHz MMIC GaN Doherty Power Amplifier with 47% Efficiency at 7dB Output Back-Off", IEEE Microwave and Wireless Components Letters, Jan. 2013, pp. 34-36, vol. 23, No. 1.

(Continued)

*Primary Examiner* — Henry Choe
(74) *Attorney, Agent, or Firm* — Coats & Bennett, PLLC

(57) ABSTRACT

An electronic package houses one or more RF amplifier circuits. At least one of an input or output impedance matching network integrated on the package and electrically coupled to the gate or drain bias voltage connection, respectively, of an amplifier circuit, includes a multi-stage decoupling network. Each multi-stage decoupling network includes two or more decoupling stages. Each decoupling stage of the multi-stage decoupling network includes a resistance, inductance, and capacitance, and is configured to reduce impedance seen by the amplifier circuit at a different frequency below an operating band of the amplifier circuit. Bias voltage connections to the impedance matching circuits may be shared, and may be connected anywhere along the multi-stage decoupling network.

45 Claims, 14 Drawing Sheets

(56) References Cited

U.S. PATENT DOCUMENTS

2009/0039966 A1    2/2009  Chow et al.

OTHER PUBLICATIONS

Iqbal, M. et al., "GaN HEMT Based Class-F Power Amplifier with Broad Bandwidth and High Efficiency", IEEE International Conference on Integrated Circuits and Microsystems, 2016, pp. 131-134.

Chen, K. et al., "Design of Highly Efficient Broadband Class-E Power Amplifier Using Synthesized Low-Pass Matching Networks", IEEE Transactions on Microwave Theory and Techniques, Dec. 2011, pp. 3162-3173, vol. 59, No. 12.

Linhart, R. et al., "Broadband Bias Networks for Pulse Signal RF Amplifiers", International Conference on Applied Electronics, Sep. 8-9, 2015, pp. 1-4, Pilsen, Czech Republic.

Pelaz, J. et al., "Experimental Control and Design of Low-Frequency Bias Networks for Dynamically Biased Amplifiers", IEEE Transactions on Microwave Theory and Techniques, Jun. 2015, pp. 1923-1936, vol. 63, No. 6.

* cited by examiner

MULTI-STAGE DECOUPLING NETWORKS INTEGRATED WITH ON-PACKAGE IMPEDANCE MATCHING NETWORKS FOR RF POWER AMPLIFIERS

FIELD OF INVENTION

The present invention relates generally to amplifiers, and in particular to multi-stage input and/or output decoupling networks integrated into a package with RF power amplifiers.

BACKGROUND

Modern wireless communication networks operate by transmitting voice and data content modulated onto Radio Frequency (RF) signals, generally between fixed access points (known as base stations, eNB, gNB, etc.) and a large number of mobile terminals (User Equipment or UE, such as smartphones, cellphones, tablets, laptops, etc.). Signal transmissions in both directions require RF power amplifiers. Efficiency (output power divided by input power) is an important consideration in both cases. Efficient power amplifiers are desired at access points because inefficient amplifiers simply turn much of the power consumed into heat, raising operating costs and requiring physical designs to discharge the heat. The power amplifier in a mobile terminal is a major consumer of battery power, and high efficiency is desired to extend the useful device lifetime per charge.

Amplifiers operate most efficiently at or near compression—the point at which an amplifier is always ON, or strongly conducting. An amplifier operating below its compression point operates in a linear range—the output signal is an amplified version of the input signal. Amplifiers that operate partially or totally in compression can transmit frequency/phase modulated signals, or On-Off Keying modulated signals (e.g., Morse code), at high power with high efficiency. In these applications, linearity is not required—that is, the amplifier may distort the signal amplitude without affecting the information modulated onto the signal. However, communication signals that encode information, even in part, by modulating the amplitude of a carrier signal require power amplifiers to operate with high linearity, to preserve the amplitude modulation (AM) information.

Many of the signal modulation schemes standardized for use in modern wireless communication networks, such as for example the various levels of Quadrature Amplitude Modulation (16-QAM, 64-QAM, 256-QAM), require a linear amplifier to avoid loss of amplitude-modulated information that would occur if the amplifier ran in compression. A characteristic of many such signals is that the average signal power is relatively low, but intermittent peaks in the signal have high power, compared to the average. This characteristic is quantified as the Peak to Average Power Ratio (PAPR). A single power amplifier transmitting a high-PAPR signal exhibits low efficiency, as it must be sized for signal peaks, which occur infrequently, and on average it runs at very low power. That is, the power amplifier must be designed with a large "headroom" that, on average, is not used. Since the operating point of the amplifier is far below its compression point, efficiency is poor. This means much of the power it consumes (from a battery in the case of a mobile terminal) is wasted as heat.

William Doherty solved this problem in 1936, designing a power amplifier having improved efficiency while transmitting high-PAPR AM radio signals. A Doherty amplifier 10, represented in block diagram form in FIG. 1, comprises a first amplifier 18a used for most signal amplification, often referred to as a "main" or "carrier" amplifier, and a second amplifier 18b used to amplify signal peaks, often referred to as an "auxiliary" or "peak" amplifier. The more general terms "first" and "second" amplifier are used herein. A class AB amplifier is often used for the first amplifier 18a, which can be biased to amplify the average signal within a linear range, but close to compression (i.e., with low headroom). Signal peaks are amplified by, e.g., a class C amplifier as the second amplifier 18b, which is inactive most of the time, and only needs to be linear over a small portion of the input signal conduction angle. The operation of a transistor as a class AB or C amplifier is established by the bias voltages applied to the gate and drain terminals.

A feature of the Doherty amplifier is the output connection of the first and second amplifiers 18a, 18b, which is made through an impedance inverter 22, often implemented using a quarter-wavelength transmission line, and having a 90-degree phase shift. At low input signal power levels, the second amplifier 18b is inactive, and the impedance inverter 22 presents a high output impedance to the first amplifier 18a, improving its efficiency. As the second amplifier 18b begins to amplify signal peaks, its output current increases the voltage across the load impedance, which the impedance inverter 22 presents to the first amplifier 18a as a decreasing impedance, allowing its output power to increase as the input signal power increases. This is known as load-modulation, and it results in the Doherty amplifier 10 exhibiting high efficiency across the full range of input signal power.

Referring to FIG. 1, a power divider circuit 12 divides an RF input signal between the first and second amplifiers 18a, 18b in response to its instantaneous power level. A phase shifter 14 delays the phase of the second amplifier 18b input by 90 degrees, to match the 90-degree delay which the output impedance inverter 22 applies to the output of the first amplifier 18a. In some embodiments, the power divider 12 and phase shifter 14 may be combined in a quadrature power divider, which both splits the input signal and applies a 90-degree phase shift to the second amplifier 18b input. Input RF impedance matching circuits 16a, 16b perform impedance matching, e.g., matching a standard 50Ω system impedance to the low input impedances of the first and second amplifiers 18a, 18b. Similarly, output RF impedance matching circuits 20a, 20b match the output impedance of the first and second amplifiers 18a, 18b to the load impedance $Z_{load}$ seen by the amplifiers 18a, 18b. Both the input and output impedance matching circuits 16, 20 are designed to operate across the entire operating bandwidth of the Doherty amplifier 10.

As described above, the outputs of the first and second amplifiers 18a, 18b in a Doherty configuration are connected by an impedance inverter 22 having a 90-degree phase delay. The impedance inverter 22 is often implemented using a quarter-wavelength transmission line. The output of the Doherty amplifier 10 is taken at a so-called summing node, typically on the second amplifier 18b side of the impedance inverter 22. An output impedance matching network (OMN) 24, such as an impedance transformer, matches the load impedance $Z_{load}$ to the standard 50Ω system impedance.

FIG. 2 is a simplified circuit model of the core of a Doherty amplifier 10, in which the first and second amplifiers 18a, 18b are modeled as ideal current sources. The impedance inverter 22 is a quarter-wave transmission line, with a 90-degree phase shift. The combined output power is taken from the summing node, and the load is represented by a resistor $R_{sum}$. The input power divider 12, phase shifter 14, and input and output impedance matching circuits 16, 20 are omitted for clarity.

Real-world RF power amplifiers 18a, 18b, such as Laterally Diffused Metal Oxide Semi-conductor (LDMOS), Gallium Nitride (GaN) Field Effect Transistor (FET), or High Electron Mobility Transistor (HEMT) devices, generate distortion across the required bandwidth, especially in the video frequencies, such as around 100 MHz. One known approach to mitigate this distortion is the use of decoupling capacitors. FIG. 3A depicts an amplifier 18, with input and output RF impedance matching networks 16, 20. Also depicted in FIG. 3A are the gate and drain bias feed circuits required to bias the transistor 18 to the desired class of operation (e.g., class AB for the first amplifier 18a and class C for the second amplifier 18b). These bias feed circuits include RF capacitance $C_{RF}$, decoupling capacitors $C_{DC}$, and the λ/4 transmission line. The RF capacitances $C_{RF}$, which may for example be in the 10-20 pF range, provide a short circuit for the quarter-wavelength for impedance matching. That is, on the gate bias feed circuit, for example, $C_{RF}$ is effectively a short circuit at RF frequencies. The decoupling capacitors $C_{DC}$, which may for example be in the 10 uF range, mitigate distortion at lower frequencies, for example below 100 MHz.

FIG. 3B depicts an implementation of the circuit of FIG. 3A on a circuit package. As known in the art, a circuit package may include one or more RF amplifier circuits (e.g., transistor amplifiers), as well as other circuits, such as impedance matching circuits, power distribution circuits, clock generation and distribution circuits, and the like. A circuit package facilitates incorporating the amplifier circuit (s) into another circuit by providing a physical, mechanical, and electrical connection to, e.g., a Printed Circuit Board (PCB). As electronic device sizes continue to shrink, in many cases the size of a package is limited by the number, and relative size, of pins, pads, or similar interface elements that connect circuits on the package with the PCB (herein, "connectors"). The amplifier 18 is implemented as a transistor (e.g., a LDMOS or GaN HEMT). The input and output RF impedance matching circuits 16, 20 are implemented as LC networks formed on the package, although in other embodiments some or all of the LC circuits may be external to the package. The capacitances $C_{RF}$ and $C_{DC}$ are generally external to the package. The λ/4 transmission line is represented as the feed inductance $L_F$ of bond wires connecting the gate or drain bias voltage to the respective RF impedance matching circuit 16, 20.

A known issue with the gate and drain bias voltage feed circuits is that resonance caused by the combination of the capacitors and inductances is close to the band of operation, which limits the improvement in linearity. Hence, a primary challenge to highly linear, broadband operation of Doherty amplifiers is to minimize the bias voltage feed inductance $L_F$, to keep the resonance away from the operating band. This need is further exasperated as the bandwidth requirements for RF power amplifiers continue to grow, e.g. due to increases in the data rates of advanced wireless communication networks. Accordingly, maintaining linear operation of the amplifier over the entire, expanded bandwidth is a challenge.

Another challenge is to minimize space, weight, and power consumption—particularly for amplifiers used in communications systems. For example, the Advanced Antenna System (AAS) is targeted to large scale deployments in existing 4G and future 5G wireless communication networks. AAS employs advanced antenna techniques such as beamforming and Multiple Input, Multiple Output (MIMO) techniques to improve end-user experience, capacity and coverage. AAS envisions not only numerous antennas per device (e.g., 100's of antennas at a base station), but also antennas comprising large arrays of individually controllable antenna elements (i.e., for beam forming). Each antenna or antenna element will, in general, require a separate RF power amplifier. Accordingly, RF power amplifiers and associated circuits must be very small and highly integrated, and power consumption must be minimized.

The Background section of this document is provided to place embodiments of the present invention in technological and operational context, to assist those of skill in the art in understanding their scope and utility. Approaches described in the Background section could be pursued, but are not necessarily approaches that have been previously conceived or pursued. Unless explicitly identified as such, no statement herein is admitted to be prior art merely by its inclusion in the Background section.

SUMMARY

The following presents a simplified summary of the disclosure in order to provide a basic understanding to those of skill in the art. This summary is not an extensive overview of the disclosure and is not intended to identify key/critical elements of embodiments of the invention or to delineate the scope of the invention. The sole purpose of this summary is to present some concepts disclosed herein in a simplified form as a prelude to the more detailed description that is presented later.

According to one or more embodiments described and claimed herein, an electronic package houses one or more RF amplifier circuits. At least one of an input or output impedance matching network integrated on the package and connected to the gate or drain bias voltage connection, respectively, of an amplifier circuit, includes a multi-stage decoupling network. Each multi-stage decoupling network includes two or more decoupling stages. Each decoupling stage of the multi-stage decoupling network includes a resistance, inductance, and capacitance, and is configured to reduce impedance seen by the amplifier circuit at a different frequency below an operating band of the amplifier circuit. The component values of each decoupling stage are selected such that the decoupling stage resonates at a different, characteristic frequency below the amplifier circuit operating band, presenting a low impedance path to RF signal ground at and near the resonance frequency. In combination, the plurality of decoupling stages effectively reduces the low frequency impedance in drain and gate bias feed networks at the reference plane implemented inside the package. This enables the design of Doherty RF power amplifiers (both main and auxiliary) with wide signal bandwidth. Accordingly, a compact power RF amplifier achieves wideband linearity and reduction in RF power amplifier size. Each decoupling stage may be configured as a resistance and inductance connected in series, with a shunt capacitance (referred to herein as a "type 1" stage), with the decoupling stages connected in series. Alternatively, each decoupling stage may be configured as a resistance, inductance, and capacitance connected in series (referred to herein as a "type 2" stage), with decoupling stages connected in shunt configuration. The bias voltage connections may be shared, and may be connected anywhere along the multi-stage decoupling network.

One embodiment relates to an amplifier circuit. The amplifier circuit includes at least a first RF amplifier circuit having source, gate, and drain terminals, the source terminal being connected to RF signal ground. The amplifier circuit further includes a first RF input connector connected to the gate terminal of the first amplifier circuit, and a first RF output connector connected to the drain terminal of the first amplifier circuit. The amplifier circuit also includes at least one of: a first input impedance matching network connected to the gate terminal of the first amplifier circuit, and a first output impedance matching network connected to the drain terminal of the first amplifier circuit. At least one first impedance matching network includes a multi-stage decoupling network comprising two or more decoupling stages. Each decoupling stage of the multi-stage decoupling network is configured to reduce impedance at a different frequency below an operating band of the amplifier circuit.

Another embodiment relates to a method of manufacturing an amplifier circuit. At least a first RF amplifier circuit having source, gate, and drain terminals is provided, and the source terminal is connected to RF signal ground. A first RF input connector is connected to the gate terminal of the first amplifier circuit. A first RF output connector is connected to the drain terminal of the first amplifier circuit. At least one of: a first input impedance matching network is connected to the gate terminal of the first amplifier circuit, and a first output impedance matching network is connected to the drain terminal of the first amplifier circuit. At least one first impedance matching network comprises a multi-stage decoupling network comprising two or more decoupling stages. Each decoupling stage of the multi-stage decoupling network configured to reduce impedance at a different frequency below an operating band of the amplifier circuit.

BRIEF DESCRIPTION OF THE DRAWINGS

The present invention will now be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

DETAILED DESCRIPTION

Figure 1:
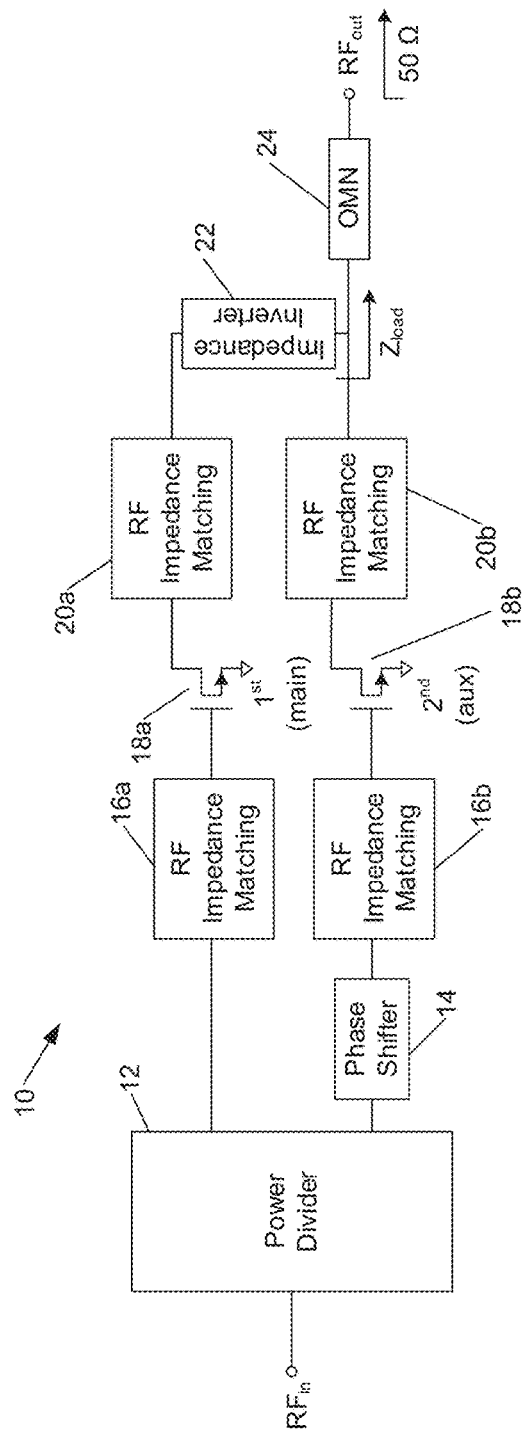
FIG. 1 is a block diagram of a conventional Doherty amplifier circuit.
Figure 2:
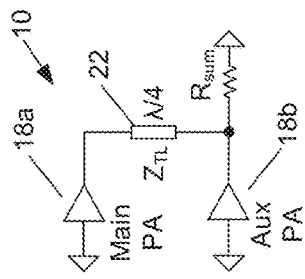
FIG. 2 is an equivalent circuit model of the Doherty amplifier circuit of FIG. 1.

For simplicity and illustrative purposes, the present invention is described by referring mainly to an exemplary embodiment thereof. In the following description, numerous specific details are set forth in order to provide a thorough understanding of the present invention. However, it will be readily apparent to one of ordinary skill in the art that the present invention may be practiced without limitation to these specific details. In this description, well known methods and structures have not been described in detail so as not to unnecessarily obscure the present invention.

Radio Frequency (RF) amplifiers are widely used in devices comprising or operating in mobile wireless communications networks, as well as other applications. RF amplifiers are typically formed as semiconductor integrated circuit chips. Most RF amplifiers are implemented in silicon or using wide bandgap semiconductor materials, such as silicon carbide ("SiC") and Group III nitride materials. As used herein, the term "Group III nitride" refers to those semiconducting compounds formed between nitrogen and the elements in Group III of the periodic table, usually aluminum (Al), gallium (Ga), and/or indium (In). Group III nitrides have a larger bandgap as compared to many other semiconductor materials and are thereby suitable for higher power and higher frequency applications. At the junction of layers formed from materials having different bandgaps, a heterojunction is formed. While GaN is of particular interest, in general, a Group III nitride heterojunction for an RF amplifier (in particular, a HEMT) may be formed from a binary, ternary, or quaternary alloy of Group III metals and Nitrogen. This formulation may be expressed as $Al_xIn_yGa_{1-x-y}N$, where $0<=x<=1$ and $0<=y<=1$—that is, any combination of some or all of Aluminum, Indium, and Gallium alloyed with Nitrogen. In particular, the density of the various alloys may be altered to control the properties of the semiconductor. For example, Aluminum increases the bandgap of GaN, while Indium reduces it.

Silicon-based RF amplifiers are typically implemented using laterally diffused metal oxide semiconductor ("LDMOS") transistors. Silicon LDMOS RF amplifiers can exhibit high levels of linearity and may be relatively inexpensive to fabricate. Group III nitride-based RF amplifiers are typically implemented using High Electron Mobility Transistors ("HEMT") and are primarily used in applications requiring high power and/or high frequency operation where LDMOS transistor amplifiers may have inherent performance limitations.

RF amplifiers may include one or more amplification stages, with each stage typically implemented as a transistor amplifier. In order to increase the output power and current handling capabilities, RF amplifiers are typically implemented in a "unit cell" configuration in which a large number of individual "unit cell" transistors are arranged electrically in parallel. The RF amplifier may be implemented as a single integrated circuit chip or "die," or may include a plurality of dies. When multiple RF amplifier die are used, they may be connected in series and/or in parallel.

Figure 3A:
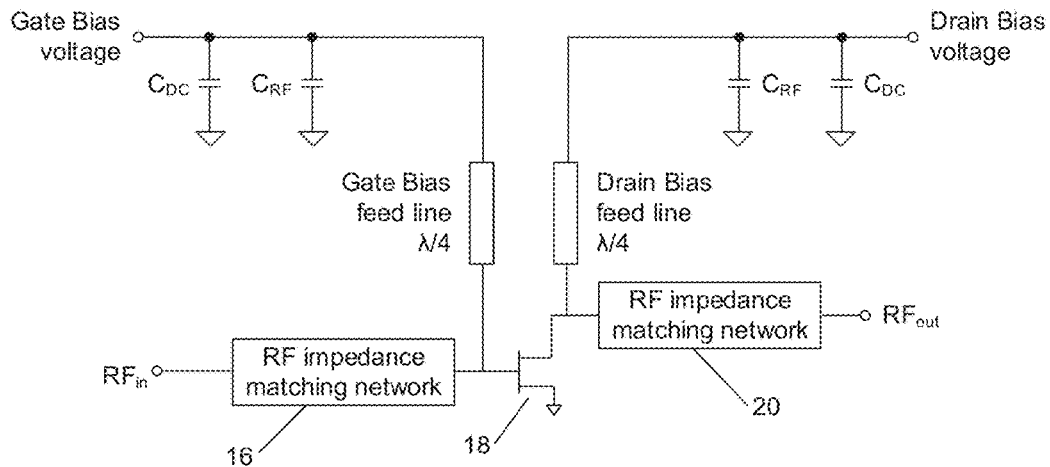
FIG. 3A is a block diagram of an amplifier with bias voltage feed circuits.

In addition to the impedance matching circuits 16, 20 discussed above with reference to FIGS. 1, 3A, and 3B, RF amplifiers may additionally include harmonic termination circuits that are designed to at least partly terminate harmonics that may be generated during device operation, such as second and third order harmonics. Additionally, as described further herein, impedance matching circuits 16, 20 may include multi-stage decoupling networks that present low impedance paths to RF signal ground at low frequencies, such as below an amplifier's operating band. The RF amplifier die(s), as well as the impedance matching circuits, harmonic termination circuits, and multi-stage decoupling networks, may be enclosed in a package. Electrical leads may extend from the package that are used to electrically connect the RF amplifier to external circuit elements such as input and output RF transmission lines, and bias voltage sources.

Figure 4A:
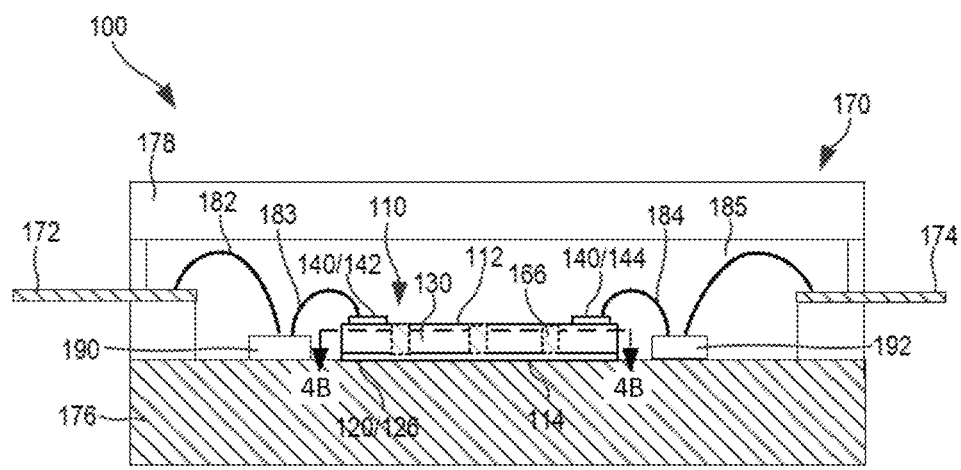
FIG. 4A is a side sectional view of a packaged RF amplifier.
Figure 4B:
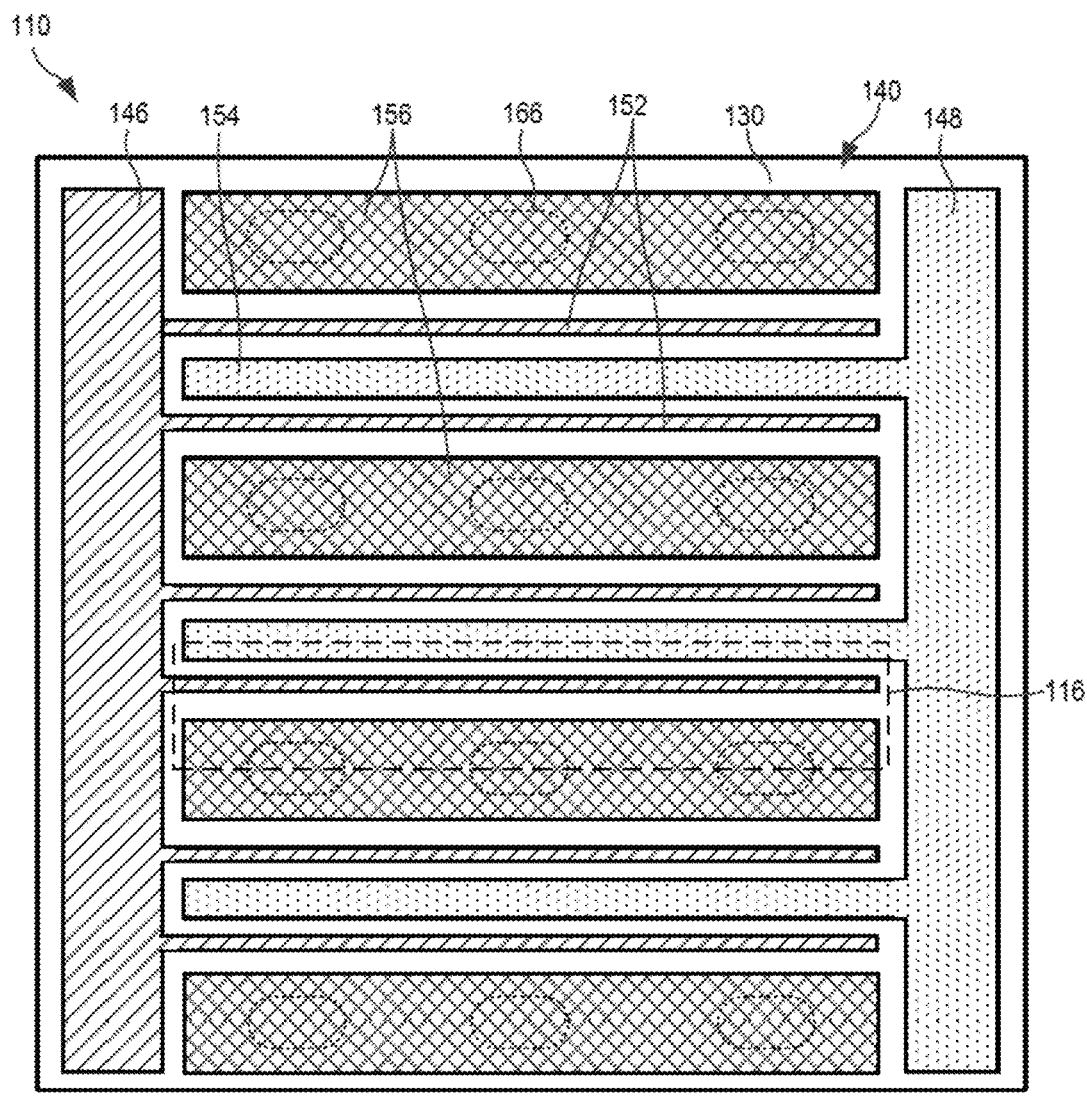
FIG. 4B is a plan sectional view of the RF amplifier of FIG. 4A.

As noted above, Group III nitride-based RF amplifiers are often used in high power and/or high frequency applications. Typically, high levels of heat are generated within the Group III nitride-based RF amplifier die(s) during operation. If the RF die(s) become too hot, the performance (e.g., output power, efficiency, linearity, gain, etc.) of the RF amplifier may deteriorate and/or the RF amplifier die(s) may be damaged. As such, Group III nitride-based RF amplifiers are typically mounted in packages that may be optimized for heat removal. FIGS. 4A and 4B illustrate one embodiment of a packaged Group III nitride-based RF amplifier. In particular, FIG. 4A is a side section view of a packaged Group III nitride-based RF amplifier 100, and FIG. 4B is a plan section view of the RF transistor amplifier die that is included in the packaged Group III nitride-based RF transistor amplifier 100, where the cross-section is taken along line 4B-4B of FIG. 4A. It will be appreciated that FIGS. 4A and 4B (and various of the other figures) are highly simplified diagrams and that actual RF amplifiers may include many more unit cells and various circuitry and elements that are not shown in the simplified figures herein.

As shown in FIG. 4A, the Group III nitride-based RF amplifier 100 includes an RF amplifier die 110 that is mounted within an open cavity package 170. The package 170 includes a gate lead 172, a drain lead 174, a metal flange 176 and a ceramic sidewall and lid 178. The RF transistor amplifier die 110 is mounted on the upper surface of the metal flange 176 in a cavity formed by the metal flange 176 and the ceramic sidewall and lid 178. The RF amplifier die 110 has a top side 112 and a bottom side 114. The RF amplifier die 110 includes a bottom side (also referred to as a "back" side) metallization structure 120, a semiconductor layer structure 130 and a top side metallization structure 140 that are sequentially stacked. The back side metallization structure 120 comprises a source terminal 126. The RF amplifier 100 may be a HEMT-based RF amplifier, in which case the semiconductor layer structure 130 may include at least a channel layer and a barrier layer, which are typically formed on a semiconductor or insulating growth substrate (such as a SiC or sapphire substrate). The top side metallization structure 140 includes, among other things, a gate terminal 142 and a drain terminal 144.

Input matching circuits 190 and/or output matching circuits 192 may also be mounted within the housing 170. The matching circuits 190, 192 may be impedance matching circuits that match the impedance of the fundamental component of RF signals input to or output from the RF transistor amplifier 100 to the impedance at the input or output of the RF transistor amplifier die 110. The impedance matching circuits may include multi-stage decoupling networks that shunt low frequency signals, such as below the amplifier's operating frequency, to RF signal ground. Additionally or alternatively, the matching circuits 190, 192 may be harmonic termination circuits that are configured to short to ground harmonics of the fundamental RF signal that may be present at the input or output of the RF transistor amplifier die 110, such as second order or third order harmonics.

As schematically shown in FIG. 4A, the input and output matching circuits 190, 192 may be mounted on the metal flange 176. The gate lead 172 may be connected to the input matching circuit 190 by one or more first bond wires 182, and the input matching circuit 190 may be connected to the gate terminal 142 of RF amplifier die 110 by one or more second bond wires 183. Similarly, the drain lead 174 may be connected to the output matching circuit 192 by one or more fourth bond wires 185, and the output matching circuit 192 may be connected to the drain terminal 144 of RF amplifier die 110 by one or more third bond wires 184. The source terminal 126 of RF transistor amplifier die 110 may be mounted directly on the metal flange 176. The metal flange 176 may provide the electrical connection to the source terminal 126 and may also serve as a heat dissipation structure. The first through fourth bond wires 182-185 may form part of the input and/or output matching circuits. The housing 178 may comprise a ceramic housing, and the gate lead 172 and the drain lead 174 may extend through the housing 178. The housing 178 may comprise multiple pieces, such as a frame that forms the lower portion of the sidewalls and supports the gate and drain leads 172, 174, and a lid that is placed on top of the frame. The interior of the device may comprise an air-filled cavity.

FIG. 4B is a plan sectional view of the RF amplifier die 110 that is taken through a portion of the top side metallization structure 140. Dielectric layers that isolate the various conductive elements of the top-side metallization structure 140 from each other are not shown in FIG. 4B to simplify the drawing.

As shown in FIG. 4B, the RF amplifier die 110 comprises a Group III nitride-based HEMT RF amplifier that has a plurality of unit cell transistors 116 that each include a gate finger 152, a drain finger 154 and a source finger 156. The gate fingers 152 are electrically connected to a common gate bus 146, and the drain fingers 154 are electrically connected to a common drain bus 148. The gate bus 146 is electrically connected to the gate terminal 142 (e.g., through a conductive via that extends upwardly from the gate bus 146) which is implemented as a gate bond pad (see FIG. 4A), and the drain bus 148 is electrically connected to the drain terminal 144 (e.g., through a conductive via that extends upwardly from the drain bus 148) which is implemented as a drain bond pad (see FIG. 4A). The source fingers 156 are electrically connected to the source terminal 126 via a plurality of conductive source vias 166 that extend through the semiconductor layer structure 130. The conductive source vias 166 may comprise metal-plated vias that extend completely through the semiconductor layer structure 130.

Referring again to FIG. 4A, the metal flange 176 may act as a heat sink that dissipates heat that is generated in the RF amplifier die 110. The heat is primarily generated in the upper portion of the RF amplifier die 110 where relatively high current densities are generated in, for example, the channel regions of the unit cell transistors 116. This heat may be transferred though both the source vias 166 and the semiconductor layer structure 130 to the metal flange 176.

Figure 5:
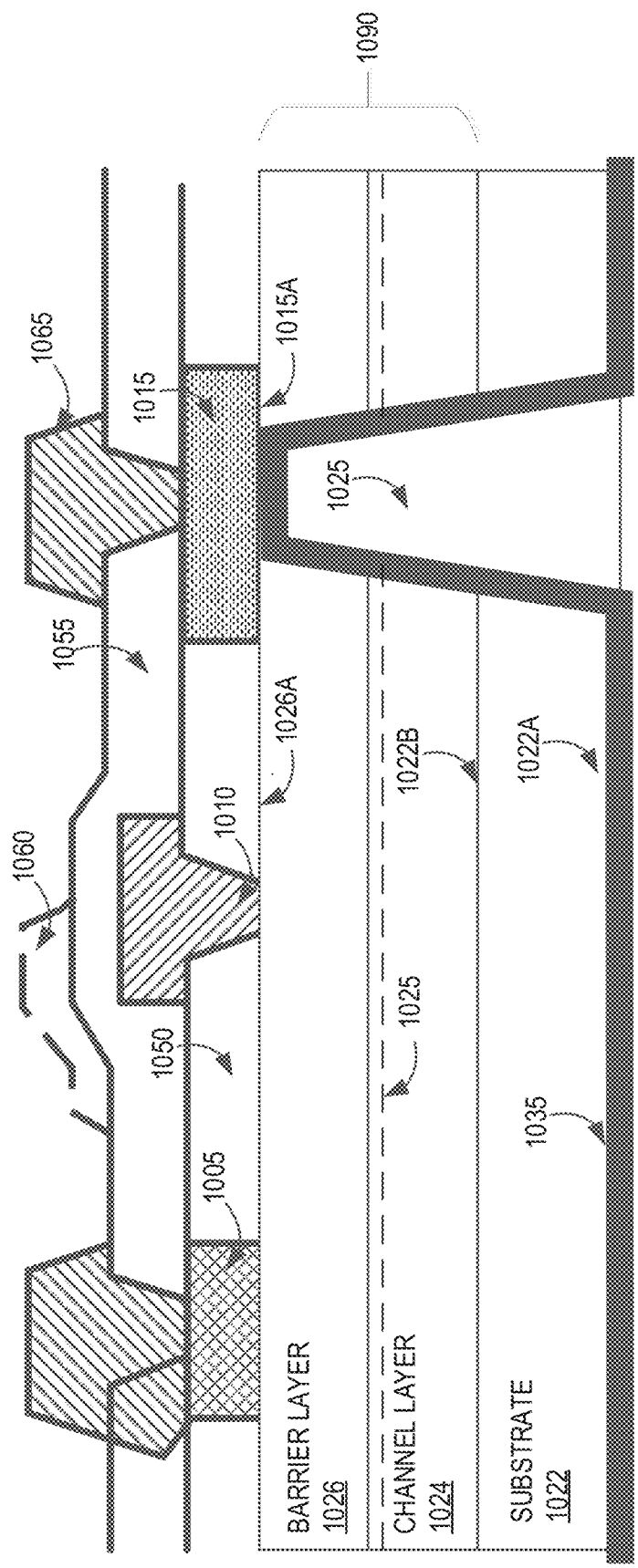
FIG. 5 is a side sectional view of an HEMT device.

FIG. 5 is a side sectional view of a conventional HEMT device 1000. For example, FIG. 5 can be a cross section of FIG. 4B as outlined by the unit cell transistors 116. A semiconductor structure 1090, such as a semiconductor structure for a Group III nitride semiconductor HEMT, may be formed on a substrate 1022 such as a Si or SiC substrate, or even a sapphire substrate. The substrate 1022 may be a semi-insulating SiC substrate that may be, for example, the 4H polytype of silicon carbide. Other silicon carbide candidate polytypes may include the 3C, 6H, and 15R polytypes. The substrate may be a High Purity Semi-Insulating (HPSI) substrate, available from Cree, Inc. The term "semi-insulating" is used descriptively herein, rather than in an absolute sense.

In some embodiments of the present invention, the Si or SiC bulk crystal of the substrate 1022 may have a resistivity equal to or higher than about $1\times10^5$ ohm-cm at room temperature. Exemplary Si or SiC substrates that may be used in some embodiments of the present invention are manufactured by, for example, Cree, Inc., of Durham, N.C., the assignee of the present invention. Methods for producing such substrates are described, for example, in U.S. Pat. No. Re. 34,861, U.S. Pat. Nos. 4,946,547, 5,200,022, and 6,218, 680, the disclosures of which are incorporated by reference herein in their entireties. Although Si or SiC can be used as a substrate material, embodiments of the present application may utilize any suitable substrate. The substrate 1022 can be a Si or SiC wafer, and the HEMT device 1000 can be formed, at least in part, via wafer-level processing, and the wafer can then be diced to provide a plurality of individual HEMTs 1000.

As shown in FIG. 5, a channel layer 1024 is formed on an upper surface 1022B of the substrate 1022, and a barrier layer 1026 is formed on an upper surface of the channel layer 1024. The channel layer 1024 and the barrier layer 1026 can each be formed by epitaxial growth in some embodiments. Techniques for epitaxial grown of Group III nitrides have been described in, for example, U.S. Pat. Nos. 5,210,051, 5,393,993, and 5,523,589, the disclosures of which are also incorporated by reference herein in their entireties. The channel layer 1024 and the barrier layer 1026 can include Group III nitride-based materials.

In particular, in one embodiment, the channel layer 1024 may be formed of GaN, and the barrier layer 1026 may be formed of AlGaN. As used herein, AlGaN is an abbreviation for the formula $Al_xGa_{1-x}N$, $0 \leq x < 1$, meaning the concentration of Al in the alloy may be varied. Layers of AlGaN may also be graded, with the concentration of Al atoms in the lattice varying as a function of depth.

At the heterojunction between GaN and AlGaN layers 1024, 1026, the difference in bandgap energies between the higher bandgap AlGaN and the GaN creates a two-dimensional electron gas (2DEG) 1025 in the smaller bandgap GaN layer 1024, which has a higher electron affinity. The 2DEG 1025 has a very high electron concentration. Additionally, the Al content in the AlGaN layer 1026 creates a piezoelectric charge at the interface, transferring electrons to the 2DEG 1025 in the GaN layer 1024, enabling a high electron mobility. For example, sheet densities in the 2DEG 1025 of a AlGaN/GaN HEMT can exceed $10^{13}$ $cm^{-2}$. The high carrier concentration and high electron mobility in the 2DEG 1025 create a large transconductance, yielding high performance for the HEMT at high frequencies. As well known, in a HEMT, the transconductance of the 2DEG 1025 is controlled by the voltage applied to the gate terminal 1010.

While semiconductor structure 1090 is shown with channel layer 1024 and barrier layer 1026 for purposes of illustration, semiconductor structure 1090 can include additional layers/structures/elements such as a buffer and/or nucleation layer(s) between channel layer 1024 and substrate 1022, and/or a cap layer on barrier layer 1026. HEMT structures including substrates, channel layers, barrier layers, and other layers are discussed by way of example in U.S. Pat. Nos. 5,192,987, 5,296,395, 6,316,793, 6,548,333, 7,544,963, 7,548,112, 7,592,211, 7,615,774, and 7,709,269, the disclosures of which are hereby incorporated herein in their entirety by reference. For example, an AlN buffer layer may be formed on the upper surface 1022B of the substrate 1022 to provide an appropriate crystal structure transition between the SiC substrate 1022 and the reminder of the HEMT device 1000. Additionally, strain balancing transition layer(s) can also and/or alternatively be provided as described, for example, in commonly assigned U.S. Pat. No. 7,030,428, the disclosure of which is incorporated herein by reference as if set forth fully herein. The optional buffer/nucleation/transition layers may be deposited by MOCVD, MBE, and/or HYPE.

A source contact 1015 and a drain contact 1005 can be formed on an upper surface 1026A of the barrier layer 1026 and can be laterally spaced apart from each other. A gate contact 1010 can be formed on the upper surface 1026A of the barrier layer 1026 between the source contact 1015 and the drain contact 1005. The material of the gate contact 1010 can be chosen based on the composition of the barrier layer 1026, and may, in some embodiments, be a Schottky contact.

The source contact 1015 can be coupled to a reference signal such as, for example, a ground voltage. The coupling to the reference signal can be provided by a via 1025 that extends from a lower surface 1022A of the substrate 1022, through the substrate 1022 to an upper surface 1026A of the barrier layer. The via 1025 can expose a bottom surface of the ohmic portion 1015A of the source contact 1015. A backmetal layer 1035 can be formed on the lower surface 1022A of the substrate 1022 and on the side walls of the via 1025. The backmetal layer 1035 can directly contact the ohmic portion 1015A of the source contact 1015. The backmetal layer 1035 and a signal coupled thereto can be electrically connected to the source contact 1015.

The HEMT device 1000 can include a first insulating layer 1050 and a second insulating layer 1055. The first insulating layer 1050 can directly contact the upper surface of the semiconductor structure 1090 (e.g., contact the upper surface 1026A of the barrier layer 1026). The second insulating layer 1055 can be formed on the first insulating layer 1050. It will also be appreciated that more than two insulating layers can be included in some embodiments. The first insulating layer 1050 and the second insulating layer 1055 can serve as passivation layers for the HEMT device 1000.

The source contact 1015, the drain contact 1005, and the gate contact 1010 can be formed in the first insulating layer 1050. In some embodiments, at least a portion of the gate contact 1010 can be on the first insulating layer. In some embodiments, the gate contact 1010 can be formed as a T-shaped gate and/or a gamma gate, the formation of which is discussed by way of example in U.S. Pat. Nos. 8,049,252, 7,045,404, and 8,120,064, the disclosures of which are hereby incorporated herein in their entirety by reference. The second insulating layer 1055 can be formed on the first insulating layer 1050 and on portions of the drain contact 1005, gate contact 1010, and source contact 1015.

In some embodiments, field plates 1060 can be formed on the second insulating layer 1055. At least a portion of a field plate 1060 can be on the gate contact 1010. At least a portion of the field plate 1060 can be on a portion of the second insulating layer 1055 that is between the gate contact 1010 and the drain contact 1005. Field plates and techniques for forming field plates are discussed, by way of example, in U.S. Pat. No. 8,120,064, the disclosure of which is hereby incorporated herein in its entirety by reference.

Field plates 1060 are a known technique to improve the performance of Field Effect Transistor (FET) devices under high electric field operation. Field plates 1060 address the large electric field that arises in the gate-drain access region during normal operation of the FET. Devices operating with high electric fields have been known to suffer breakdown voltages, trapping effects, reduced reliability—all of which are at least partially alleviated by field plates 1060.

Field plating relies on the vertical depletion of the FET device active region, which enables larger extensions of the horizontal depletion region. This results in a lower electric field in the device active region for a given bias voltage, alleviating at least some of the detrimental effects of operating the FET device at a high electric field. Additionally, a field plate 1060 positioned in the gate drain access region has the additional capability of modulating the device active region. This decreases surface traps effects, which impair FET device operation under large RF signals. Methods of fabricating field plates on FET devices, and in particular on Group III nitride HEMT devices, are described in U.S. Pat. No. 7,812,369, the disclosure of which is hereby incorporated herein in its entirety by reference.

U.S. Pat. No. 7,812,369 describes the formation of a field plate, similar to field plate 1060, isolated from the barrier layer 1026 of a Group III nitride HEMT 1000, at least partially overlaying the gate terminal 1010, and extending over some (but less than all) of the distance from the gate terminal 1010 to the drain terminal 1005. The field plate 1060 may be electrically connected to the source terminal 1015. This arrangement reduces the peak electric field in the HEMT device 1000, resulting in increased breakdown voltage and reduced trapping, reduced leakage current, and enhanced reliability. Furthermore, the shielding effect of a source-connected field plate 1060 reduces the gate-to-drain capacitance $C_{gd}$, which enhances input-output isolation.

Metal contacts 1065 can be disposed in the second insulating layer 1055. The metal contacts 1065 can provide interconnection between the drain contact 1005, gate contact 1010, and source contact 1015 and other parts of the HEMT device 1000. Respective ones of the metal contacts 1065 can directly contact respective ones of the drain contact 1005 and/or source contact 1015.

Figure 6:
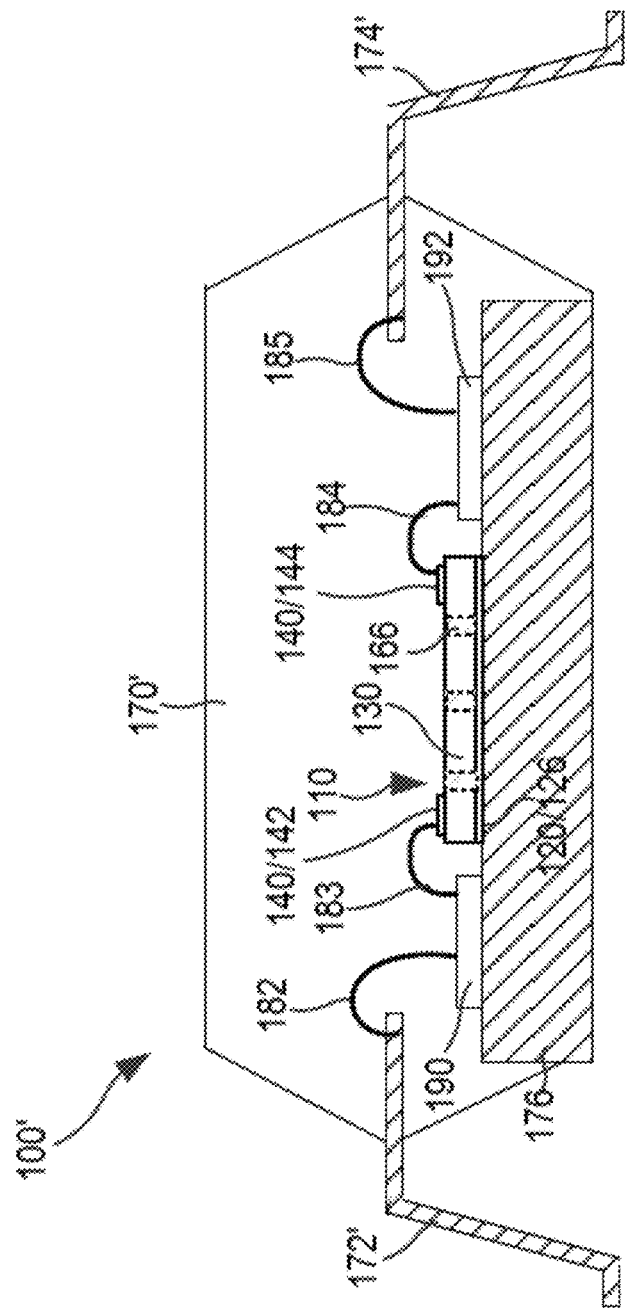
FIG. 6 is a side sectional view of an RF amplifier die.

FIG. 6 is a side sectional view of a conventional packaged Group III nitride-based RF transistor amplifier 100' that is similar to the RF transistor amplifier discussed above with reference to FIG. 4A. RF transistor amplifier 100' differs from RF transistor amplifier 100 in that it includes a different package 170'. The package 170' includes a metal submount 176 (which acts as a metal heat sink and can be implemented as a metal slug), as well as gate and drain leads 172', 174'. In some embodiments, a metal lead frame may be formed that is then processed to provide the metal submount 176 and/or the gate and drain leads 172', 174'. RF transistor amplifier 100' also includes a plastic overmold 178' that at least partially surrounds the RF transistor amplifier die 110, the leads 172', 174' and the metal submount 176. The plastic overmold 178' replaces the ceramic sidewalls and lid 178 included in RF transistor amplifier 100.

Depending on the embodiment, the packaged transistor amplifier 100' can include, for example, a monolithic microwave integrated circuit (MMIC) as the RF transistor amplifier die 110 in which case the RF transistor amplifier die 110 incorporates multiple discrete devices. When the RF transistor amplifier die 110 is a MMIC implementation, the input matching circuits 190 and/or the output matching circuits 192 may be omitted (since they may instead be implemented within the RF transistor amplifier die 110) and the bond wires 182 and/or 185 may extend directly from the gate and drain leads 172', 174' to the gate and drain terminals 142, 144. In some embodiments, the packaged RF transistor amplifier 100 can include multiple RF transistor amplifier die that are connected in series to form a multiple stage RF transistor amplifier and/or may include multiple transistor die that are disposed in multiple paths (e.g., in parallel) to form an RF transistor amplifier with multiple RF transistor amplifier die and multiple paths, such as in a Doherty amplifier configuration.

In other cases, Group III nitride-based RF amplifiers may be implemented as MMIC devices in which one or more RF amplifier die(s) are implemented together with their associated impedance matching circuits, which may include multi-stage decoupling networks, and/or harmonic termination circuits, in a single, integrated circuit die. Examples of such Group III nitride-based RF amplifiers are disclosed, for example, in U.S. Pat. No. 9,947,616, the entire content of which is incorporated herein by reference.

Figure 7:
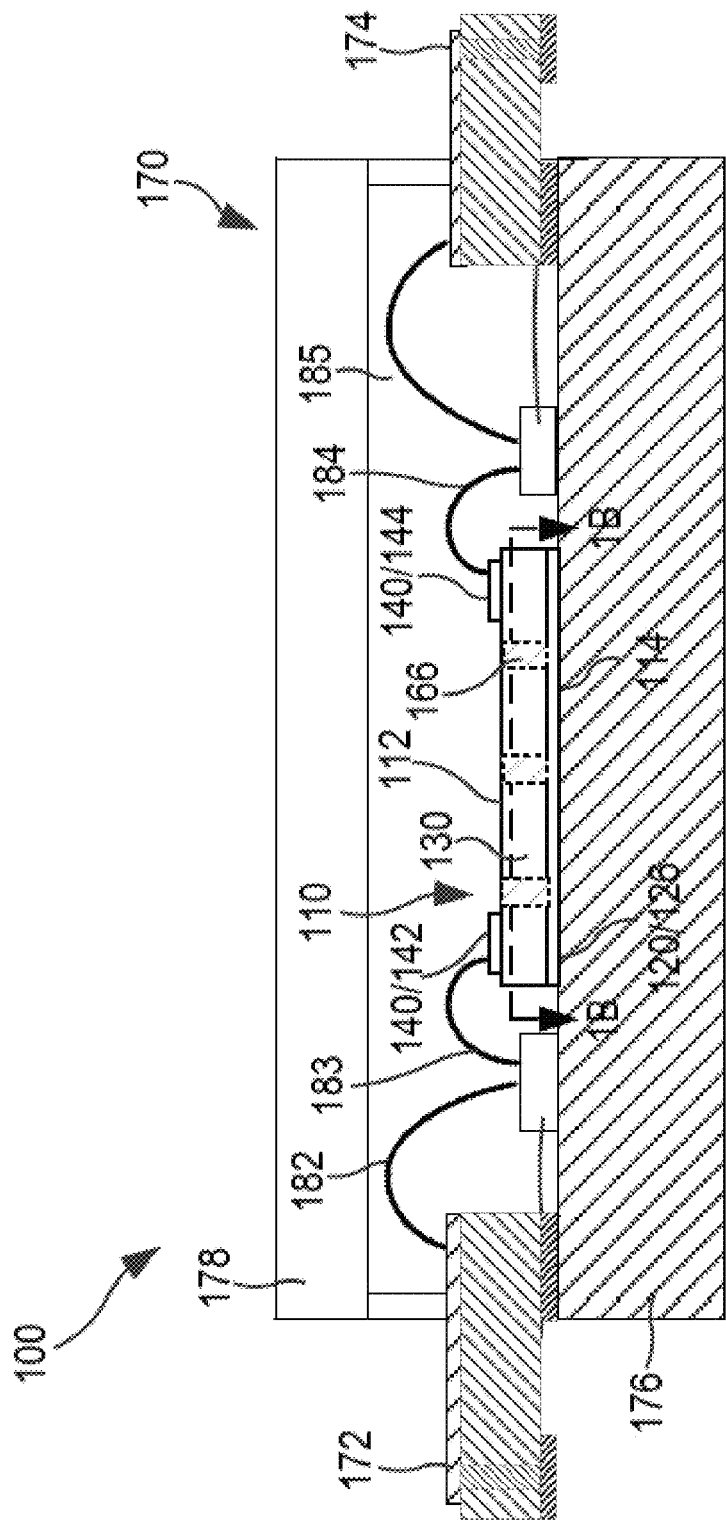
FIG. 7 is a side sectional view of a thermally enhanced IC device package.

FIG. 7 is a cross-sectional view illustrating an example of a thermally enhanced integrated circuit device package, more specifically a T3PAC package 1200. The T3PAC package 100" of FIG. 7 can be a ceramic-based package that includes a base 1201 and an upper housing with a lid member 1213 and sidewall members 1204. The lid member 1213 and sidewalls 1204 similarly define an open cavity surrounding the amplifier die 110 on the conductive base or flange 1201, which likewise provides both an attachment surface 1201 and thermal conductivity (e.g., a heat sink) for dissipating or otherwise transmitting heat outside of the package 100".

The flange 1201 can be an electrically conductive material, for example, a copper layer/laminate or an alloy or metal-matrix composite thereof. In some embodiments, the flange 1201 may include a copper-molybdenum (CuMo) layer, CPC (Cu/MoCu/Cu), or other copper alloys, such copper-tungsten CuW, and/or other laminate/multi-layer structures. In the example of FIG. 7, the flange 1201 is illustrated as a copper-molybdenum (RCM60)-based structure to which the sidewalls 1204 and/or lid member 178 are attached, e.g., by a conductive glue 1208.

The flange 1201 also provides the source lead 902s for the package 100". The gate lead 102g and drain lead 102d are provided by respective conductive wiring structure 1214 which is attached to the flange 1201 and supported by the sidewall members 1204.

Mobile wireless communications networks must support high data rates to satisfy data-intensive applications, such as video streaming. The high data rates are achieved by using larger spectrum broadband communication systems that require RF power amplifiers operating linearly over the entire bandwidth. Representative frequencies over which such RF power amplifiers must operate include R-band (0.5-1 GHz), S-band (3 GHz), X-band (10 GHz), Ku-band (12-18 GHz), K-band (18-27 GHz), Ka-band (27-40 GHz) and V-band (40-75 GHz). In general, there is now a high demand for RF transistor amplifiers with high linearity at, for example, 500 MHz and higher (including microwave frequencies). These RF transistor amplifiers must exhibit high reliability, good linearity and handle high output power levels.

As discussed above, due to RF modulation schemes that modulate information at least partially onto signal amplitude, the Doherty power amplifier has emerged as a popular architecture for RF amplifiers in both smartphones and the base stations that serve them.

Referring to FIG. 1, a Doherty amplifier 10 works by biasing the first (main) and second (auxiliary) amplifiers (18a, 18b) to operate in different classes. Accordingly, bias voltage circuits (not shown in FIG. 1) are connected to the input and output of each amplifier 18a, 18b. To match the characteristic impedance of the amplifier devices 18a, 18b to the system or transmission line impedance (typically 50Ω), impedance matching networks 16a, 20a, 16b, 20b are often added to both the input (gate) and output (drain) of both amplifier devices 18a, 18b. As discussed above, the impedance matching networks 16a, 20a, 16b, 20b may additionally include harmonic termination circuits, and as discussed further below, they may further include multi-stage decoupling networks.

Figure 3B:
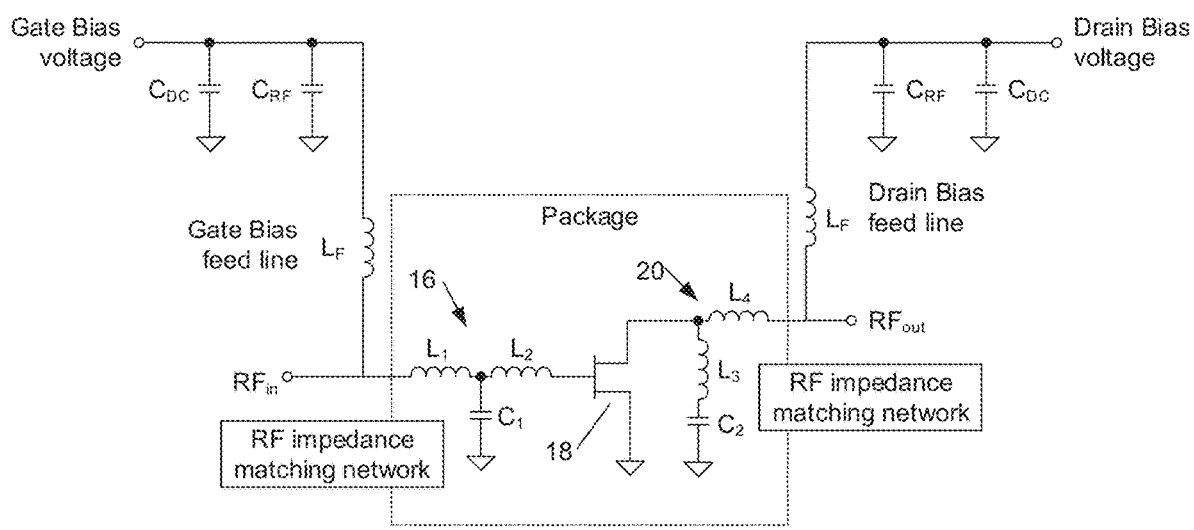
FIG. 3B is a circuit diagram of the amplifier of FIG. 3A in a package.

As depicted in FIG. 3B, decoupling capacitors $C_{DC}$ are typically connected, external to an amplifier circuit package, in shunt configuration. Shunt capacitors provide a low-impedance path to signal ground at a characteristic frequency. Accordingly, decoupling capacitors are typically used to shunt, e.g., undesired switching noise from a power supply to ground, improving the linearity of the amplifier circuit. A single decoupling capacitor may also be used in, e.g., the output impedance matching network 20 of an amplifier 18, to similarly provide a low-impedance path to signal ground at a selected frequency. Generally, the decoupling capacitor is designed to shunt low frequency portions of the output signal below its operating band—for example, frequencies below those used to carry streaming video content—to signal ground.

Figure 8:
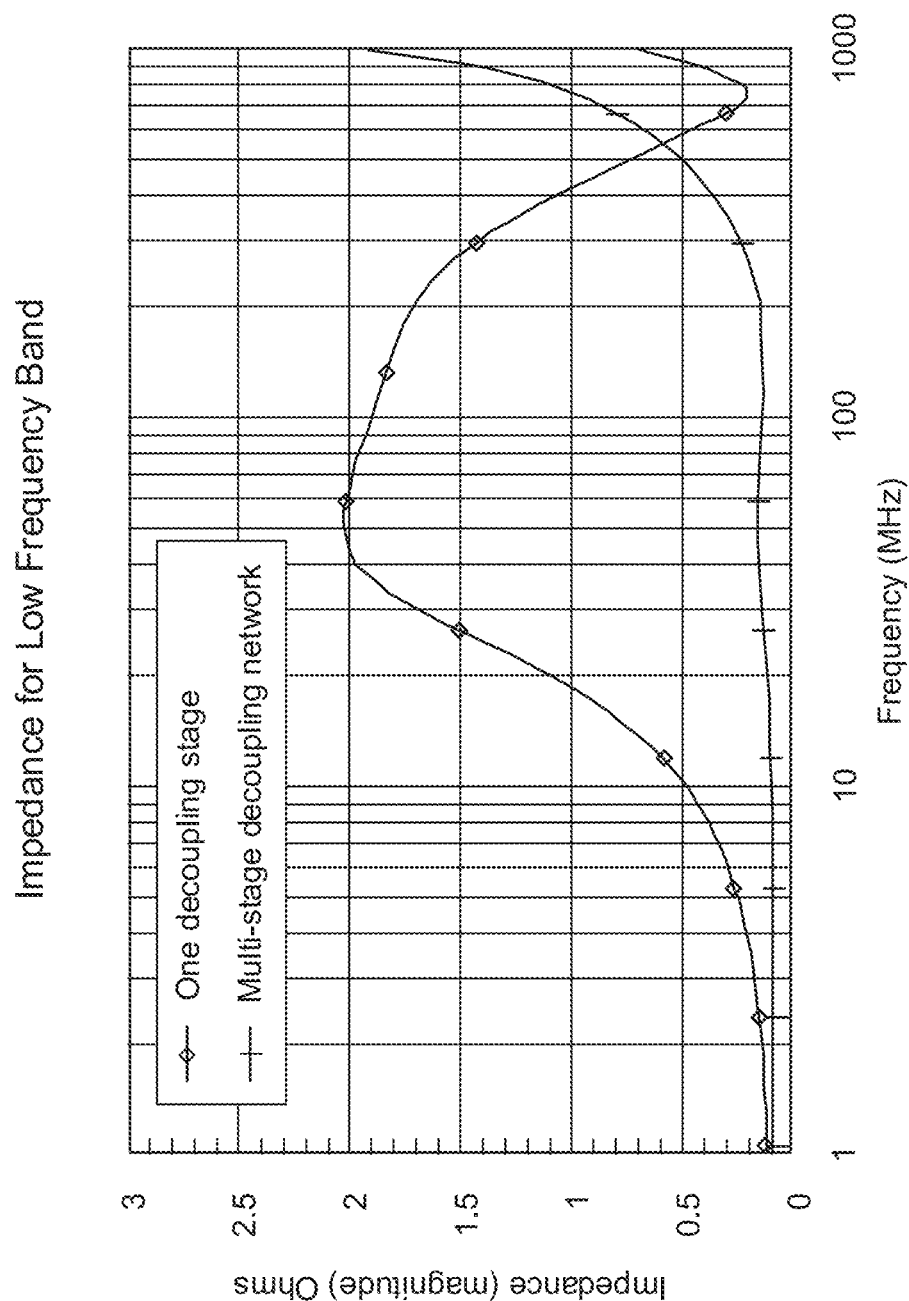
FIG. 8 is a graph of impedance seen by the amplifier in the frequency range 1 MHz to 1 GHz, for an amplifier circuit having a single decoupling stage and one having a multi-stage decoupling network.

As amplifier circuits operate over a broader bandwidth, however, a single decoupling capacitor cannot provide the desired low-impedance path to ground over the entire desired frequency range. FIG. 8 plots the impedance of an amplifier circuit over the frequency range from 1 MHz to 1 GHz. A single decoupling capacitor is operative to reduce the impedance only over the first 10 MHz. From 10 MHz to nearly 1 GHz, the impedance increases significantly. In order to maintain a low impedance across the entire lower frequency band, a multi-stage decoupling network is added to one or both of the input and output impedance matching networks of an amplifier circuit. As FIG. 8 shows, this results in a sustained low impedance across the entire frequency band, e.g. up to nearly 1 GHz. The multi-stage decoupling network comprises two or more decoupling stages, each configured to reduce impedance at a different frequency, but none of which extend across the entire low frequency range. By tuning each decoupling stage to resonate at a different frequency, the multi-stage decoupling network achieves a reduction in impedance across a broad band of frequencies, as the plot in FIG. 8 demonstrates.

Figure 9:
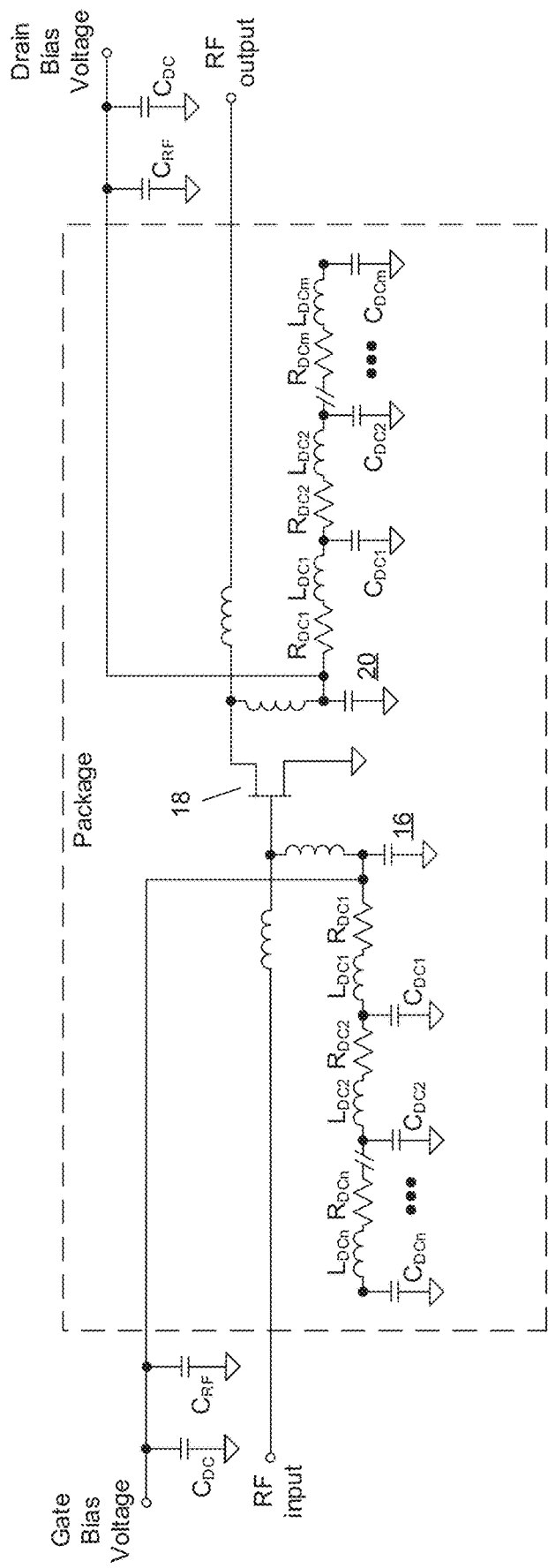
FIG. 9 is a schematic circuit diagram of an electronic circuit package housing an amplifier with input and output impedance matching circuits, each including a type 1 multi-stage decoupling network.

FIG. 9 depicts an electronic circuit package housing an RF power amplifier 18 having both input and output impedance matching circuits 16, 20. Each impedance matching circuit 16, 20 includes a multi-stage decoupling network comprising two or more decoupling stages. Each decoupling stage comprises a resistance $R_{DCx}$, an inductance $L_{DCx}$, and a capacitance $C_{DCx}$, x=1, 2, . . . , n or x=1, 2, . . . , m, as each multi-stage decoupling network may comprise a different number of stages. In the decoupling stages depicted in FIG. 9—referred to herein as "type 1" decoupling stages—the resistance $R_{DCx}$ and inductance $L_{DCx}$ are connected in series, with the capacitance $C_{DCx}$ connected in shunt to RF signal ground. The individual decoupling stages are then connected together in series. The component values for each decoupling stage are selected to achieve resonance, and hence low impedance, at a characteristic frequency. This frequency is selected to be different for each decoupling stage in the multi-stage decoupling network. Each such resonant frequency is below an operating range of the amplifier 18. By appropriately selecting the number of stages, and the resonant frequency of each stage, a consistent low impedance to RF signal ground is achieved across the entire low frequency band of operation of the amplifier 18.

Figure 10:
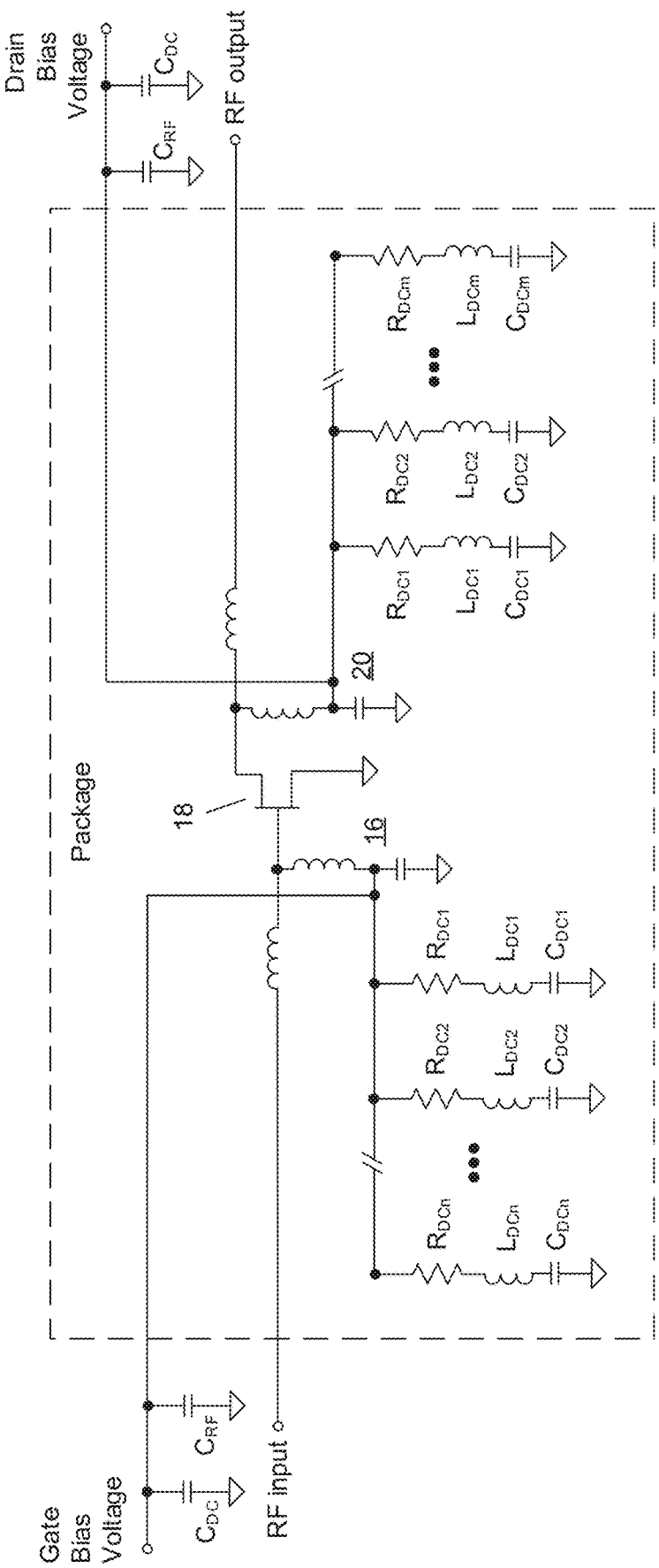
FIG. 10 is a schematic circuit diagram of an electronic circuit package housing an amplifier with input and output impedance matching circuits, each including a type 2 multi-stage decoupling network.

FIG. 10 also depicts an electronic circuit package housing an RF power amplifier 18 having both input and output impedance matching circuits 16, 20, with each impedance matching circuit 16, 20 including a multi-stage decoupling network comprising two or more decoupling stages. Similarly to FIG. 9, each decoupling stage comprises a resistance $R_{DCx}$, an inductance $L_{DCx}$, and a capacitance $C_{DCx}$, x=1, 2, . . . , n or x=1, 2, . . . , m. In this embodiment, however—referred to herein as "type 2" decoupling stages—the resistance $R_{DCx}$, inductance $L_{DCx}$, and capacitance $C_{DCx}$ are all connected in series. Each decoupling stage is connected in shunt configuration in the multi-stage decoupling network.

Figure 11:
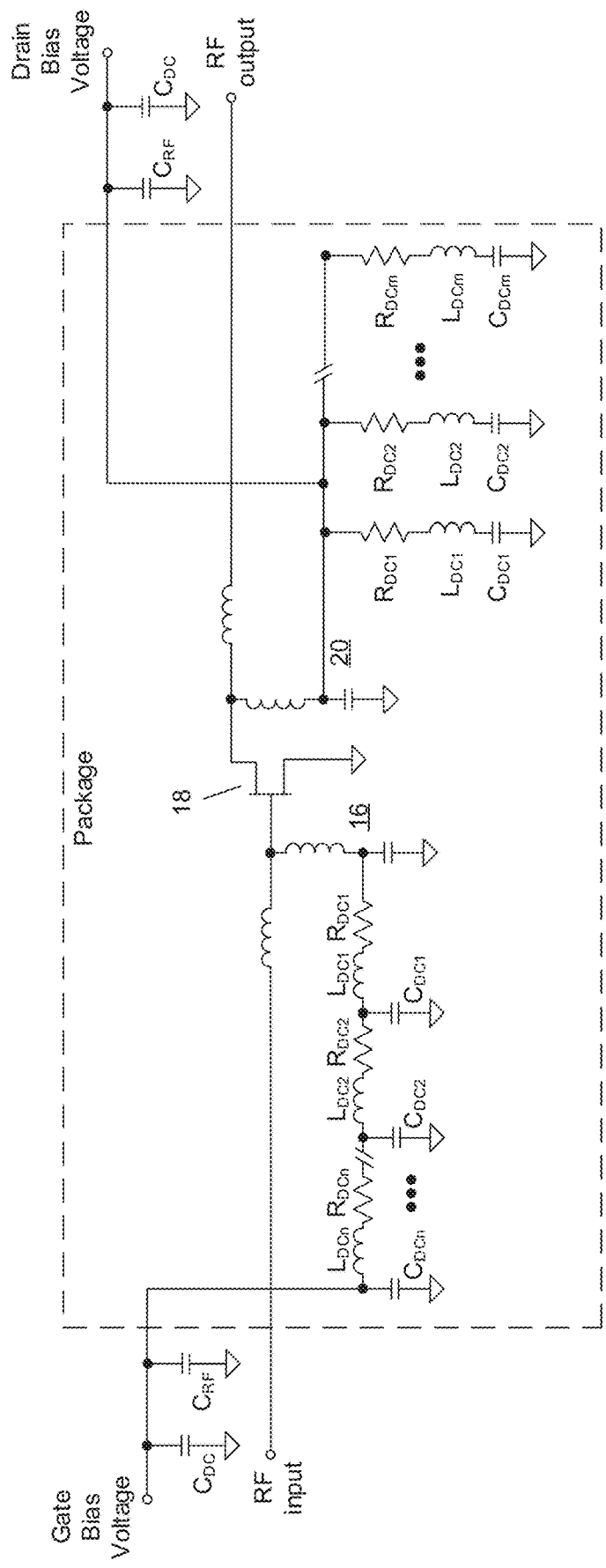
FIG. 11 is the schematic circuit diagram of FIG. 4 showing different bias voltage connection locations.

Each of the type 1 and type 2 decoupling stages can be configured to resonate at a characteristic frequency below the amplifier 18 designed operating band, and hence reduce impedance at and near that frequency. Whether type 1 or type 2 decoupling stages are employed may depend on the implementation. For example, one or the other may be easier to implement in silicon Integrated Passive Devices (IPD) or glass IPDs. Indeed, as depicted in FIG. 11, they may be used on the same package. FIG. 11 depicts a multi-stage decoupling network comprising type 1 decoupling stages integrated with the input impedance matching circuit 16, and a multi-stage decoupling network comprising type 2 decoupling stages integrated with the output impedance matching circuit 20. Again, each multi-stage decoupling network may comprise the same, or a different, number of stages (i.e., m=n or m≠n).

Note also the gate and drain bias voltage attachment points. In FIGS. 9 and 10, both the gate and drain bias voltages attached at a node between the respective impedance matching network and multi-stage decoupling network. However, this is not a limitation of embodiments of the present invention. FIG. 11 depicts the gate bias voltage connected at the outer node of the multi-stage decoupling network integrated with the input impedance matching network 16. The drain bias voltage connects to a node intermediate to the multi-stage decoupling network—that is, the output impedance matching network and at least one decoupling stage are interposed between the amplifier circuit drain terminal and the bias voltage connector. In general, a bias voltage connecter may be connected at any point along the multi-stage decoupling network.

Figure 12:
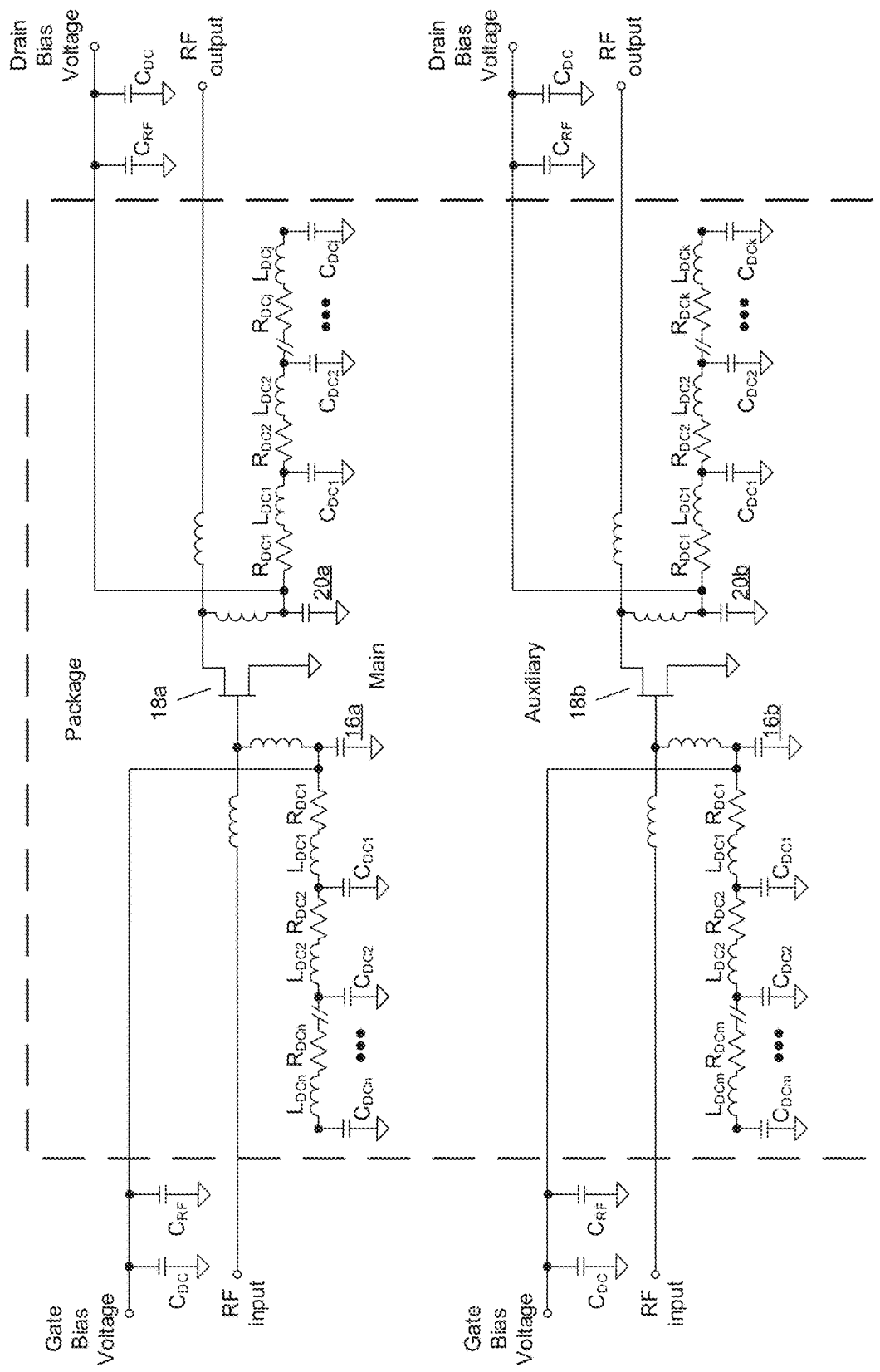
FIG. 12 is a schematic circuit diagram of an electronic circuit package housing a Doherty amplifier, with both amplifier circuits including input and output impedance matching circuits, each including a type 1 multi-stage decoupling network.

FIG. 12 depicts an electronic circuit package housing a Doherty RF power amplifier, comprising a first or main amplifier 18a and a second or auxiliary amplifier 18b. The amplifiers 18a, 18b are biased to different classes, and accordingly each has different gate and drain biasing circuits. Both amplifiers also include an input impedance matching circuit 16a, 16b and an output impedance matching circuit 20a, 20b. Each impedance matching circuit 16a, 16b, 20a, 20b includes a multi-stage decoupling network comprising two or more decoupling stages, which in this embodiment are all type 1 decoupling stages, although the multi-stage decoupling networks may have different numbers of stages. The amplifier 18a 18b outputs are connected off-package by an impedance inverter 22 (see FIG. 1). Within each multi-stage decoupling network, the component values $R_{DCx}$, $L_{DCx}$, and $C_{DCx}$ are selected to achieve a different characteristic resonant frequency below the Doherty RF amplifier operating band.

Figure 13:
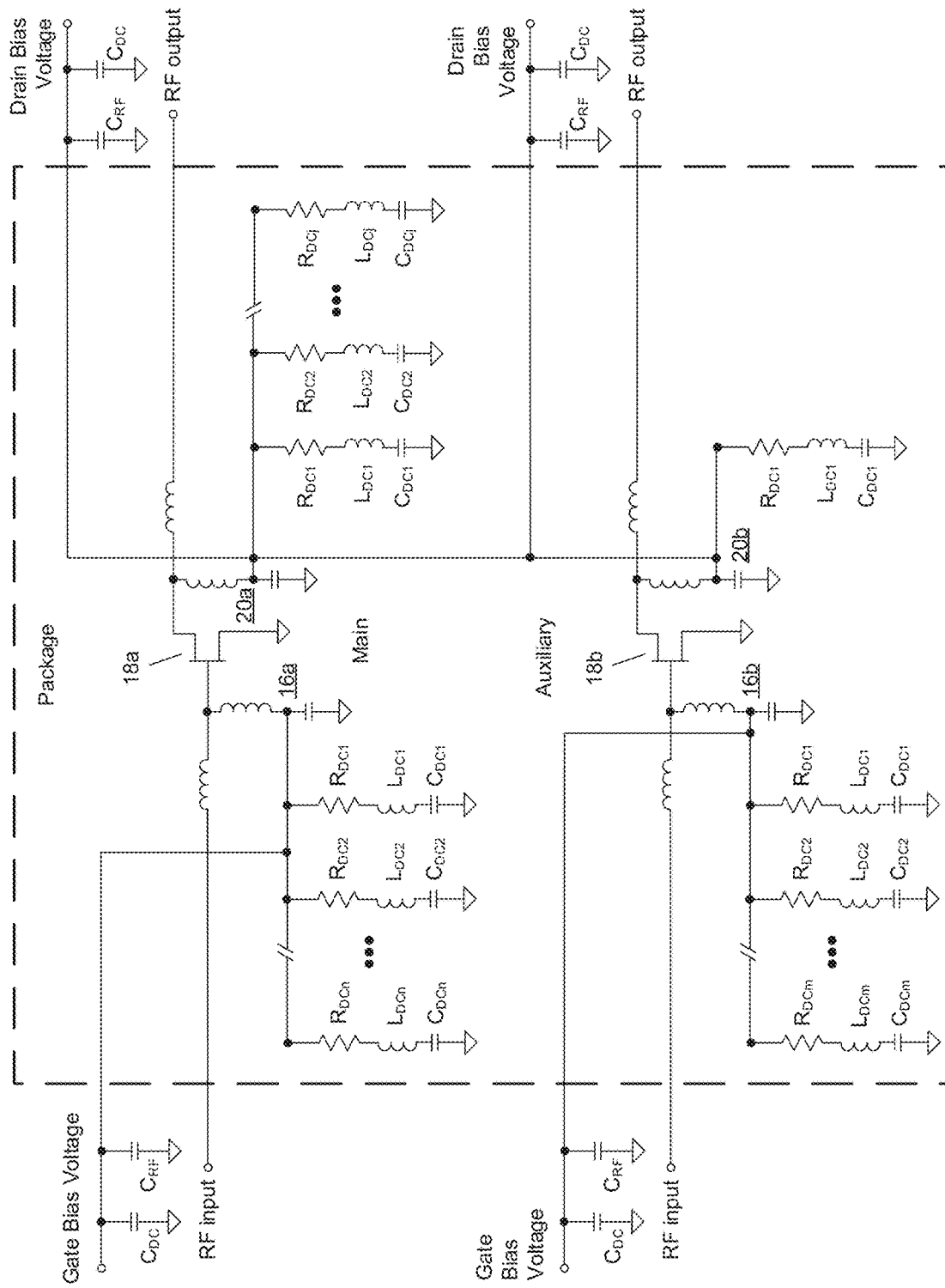
FIG. 13 is a schematic circuit diagram of an electronic circuit package housing a Doherty amplifier, with both amplifier circuits including input and output impedance matching circuits, some but not all of which include a type 2 multi-stage decoupling network.

FIG. 13 depicts an electronic circuit package housing a different Doherty RF power amplifier, also comprising a first or main amplifier 18a and a second or auxiliary amplifier 18b. Each amplifier 18a, 18b includes both input and output impedance matching circuits 16a, 20a, 16b, 20b. Three of these impedance matching circuits 16a, 20a, 16b include a multi-stage decoupling network. The output impedance matching circuit 20b of the second amplifier 18b, however, includes only a single type 2 decoupling stage. Although this will reduce impedance seen by the amplifier 18b at a characteristic frequency determined by the values $R_{DC1}$, $L_{DC1}$, and $C_{DC1}$, the reduced impedance will not extend across the entire low frequency bandwidth (that is, up to the amplifier operating band). See FIG. 8. In general, multi-stage decoupling networks may be included in one or more, but less than all, impedance matching networks 16a, 20a, 16b, 20b on the package.

In this embodiment, the gate nodes of the first and second amplifiers 18a, 18b are separately biased by independent gate bias voltage circuits. The drain bias voltages, however, are connected on-package. In general, any number of amplifier circuits may have independent bias voltage feeds, or may share bias voltages, in any combination.

Finally, note that while the bias voltages connect directly to impedance matching circuits 16b, 201, and 20b, the gate bias voltage at the input of the first amplifier 18a connects between two decoupling stages of the multi-stage decoupling networks. In general, as mentioned above, the bias voltage connections may be made anywhere adjacent to or along a multi-stage decoupling network.

Figure 14:
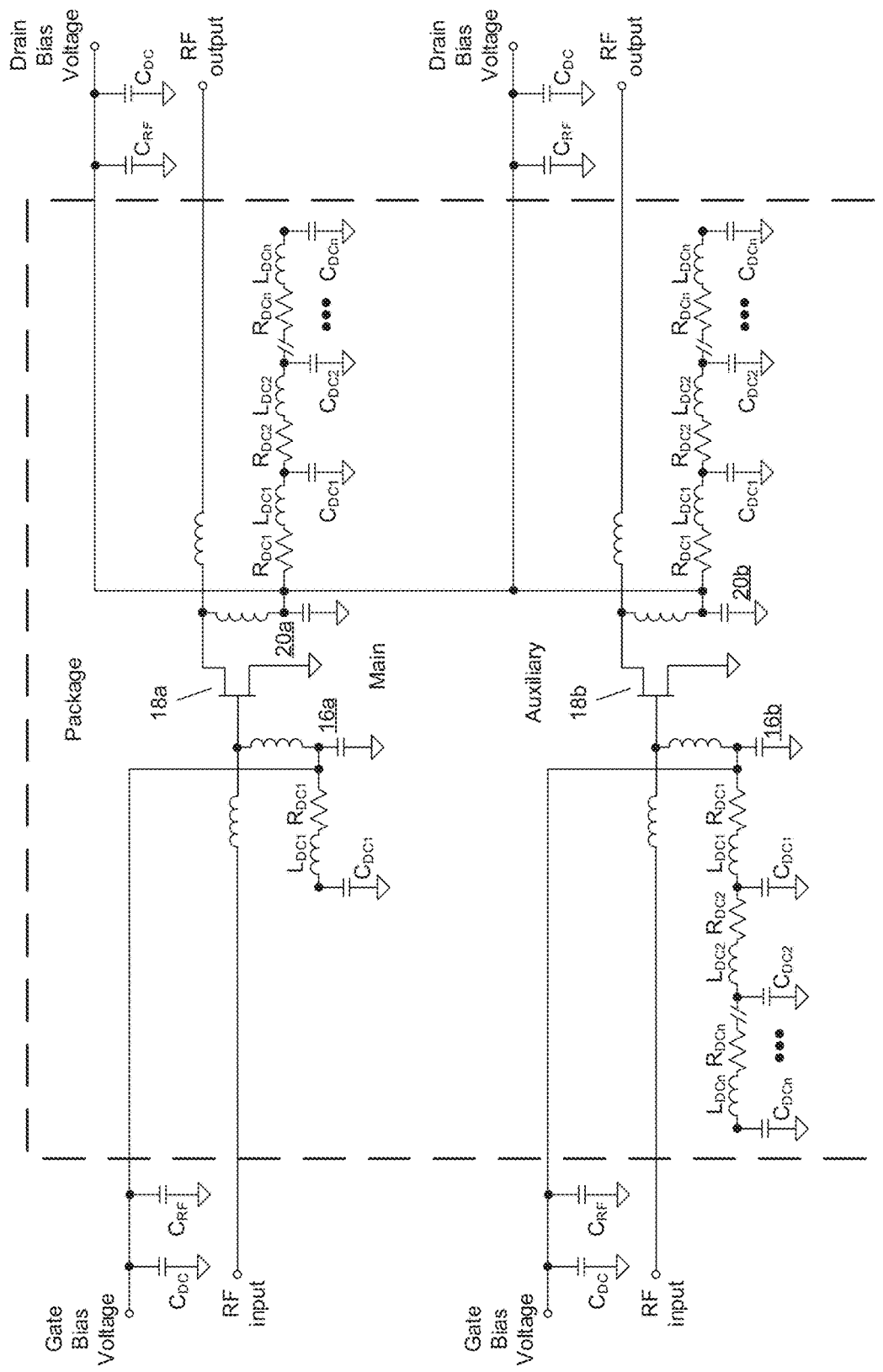
FIG. 14 is a schematic circuit diagram of an electronic circuit package housing a Doherty amplifier, with both amplifier circuits including input and output impedance matching circuits, some but not all of which include a type 1 multi-stage decoupling network.

FIG. 14 depicts an electronic circuit package housing a Doherty RF power amplifier, wherein the input impedance matching network 16a of the first amplifier 18a includes a single, type 1 decoupling stage. All other impedance matching networks 20a, 16b, 20b include a multi-stage decoupling network comprising at least two type 1 decoupling stages, with each stage tuned to resonate at a different frequency below the amplifier operating band. Additionally, note that the first and second amplifiers 18a, 18b have independent gate bias voltage circuits, but share the same drain bias voltage due to the on-package connection of the output impedance matching networks 20a, 20b.

The plethora of different configurations, options, and topologies depicted in the figures is indicative of the flexibility of embodiments of the present invention to meet the linearity needs of amplifiers, and in particular Doherty amplifiers, packaged into an electronic circuit packages. The number of multi-stage decoupling networks deployed; the number of decoupling stages in each; the topology of the decoupling stages (e.g., type 1 or type 2); the values of components in each decoupling stage (and hence the characteristic resonating frequency of each); the location of bias voltage connections; and whether bias voltages are shared; are all degrees of freedom that may be exploited by those of skill in the art to meet the low frequency impedance needs of any particular application. Selection and optimization of these various parameters is well within the skill of those of ordinary skill in the art, without undue experimentation, given the teachings of the present disclosure.

As FIG. 8 shows, the low frequency performance, and hence linearity, of a packaged Doherty amplifier may be significantly improved by employing one or more multi-stage decoupling networks, as described herein. The use of only one decoupling stage, in general, may be insufficient to provide the reduced impedance required across a broad spectrum, e.g., from 1 MHz to 1 GHz.

As one, non-limiting example, consider an amplifier circuit operating in the R-band or above, i.e., above about 500 MHz. A three-stage decoupling network may be required in one or both of the input and output impedance matching circuits. A first decoupling stage, comprising components having the smallest L-C values, may resonate in the 100 MHz-300 MHz range, providing a low impedance path to signal components in that frequency range. A second decoupling stage, comprising components with larger L-C values, may resonate (and hence suppress signal components) in the 1 MHz-30 MHz range. Finally, a third decoupling stage, having the largest L-C values, may resonate in the in the 100 KHz-900 KHz range. The combination of all three decoupling stage may offer a low impedance path to RF signal ground for signal components across the range from 100 KHz to 300 MHz—a far wider frequency band of suppression than could be achieved with a single decoupling capacitor, or by any single decoupling stage. Those of skill in the art may readily ascertain the number of decoupling stages, and the component values (and hence resonance frequency range) for each stage, appropriate to suppress signal components across frequencies below any particular amplifier circuit's operating band, given the teachings of the present disclosure.

Figure 15:
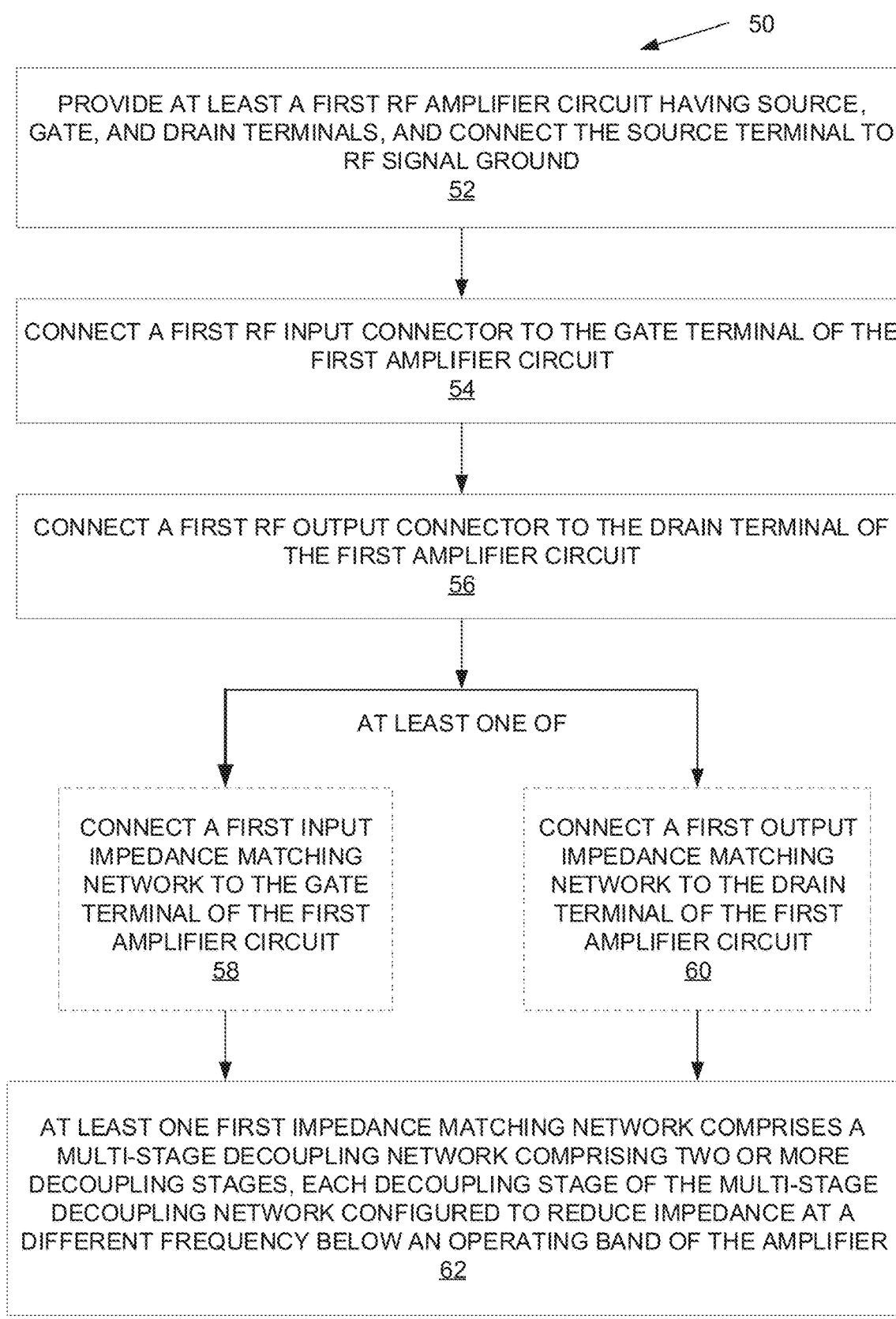
FIG. 15 is a flow diagram of a method of manufacturing an RF power amplifier circuit.

FIG. 15 depicts the steps in a method 50 of manufacturing an electronic circuit package housing one or more Radio Frequency (RF) power amplifier circuits. At least a first RF amplifier circuit having source, gate, and drain terminals is provided, and the source terminal is connected to RF signal ground (block 52). A first RF input connector is connected to the gate terminal of the first amplifier circuit (block 54). A first RF output connector is connected to the drain terminal of the first amplifier circuit (block 56). At least one of: a first input impedance matching network is connected to the gate terminal of the first amplifier circuit (block 58), and a first output impedance matching network is connected to the drain terminal of the first amplifier circuit (block 60). At least one first impedance matching network comprises a multi-stage decoupling network comprising two or more decoupling stages (block 62). Each decoupling stage of the multi-stage decoupling network is configured to reduce impedance at a different frequency below an operating band of the amplifier.

Embodiments of the present invention present numerous advantages over the prior art. In a multi-stage decoupling network comprising two or more decoupling stages, each decoupling stage can be tuned to resonate at a different frequency, where all resonant frequencies are beneath an operating band of the amplifier circuit. This enables reduction of impedance seen by the amplifier circuit across a broad low-frequency range, such as from 1 MHz to 1 GHz. This improves linearity of the amplifier across the broad spectrum required for modern wireless communication devices, such as when streaming high-resolution video.

Generally, all terms used herein are to be interpreted according to their ordinary meaning in the relevant technical field, unless a different meaning is clearly given and/or is implied from the context in which it is used. As used herein, the term "configured to" means set up, organized, adapted, or arranged to operate in a particular way; the term is synonymous with "designed to." As used herein, the terms "about," "substantially," and the like encompass and account for mechanical tolerances, measurement error, random variation, and similar sources of imprecision. All references to a/an/the element, apparatus, component, means, step, etc. are to be interpreted openly as referring to at least one instance of the element, apparatus, component, means, step, etc., unless explicitly stated otherwise. The steps of any methods disclosed herein do not have to be performed in the exact order disclosed, unless a step is explicitly described as following or preceding another step and/or where it is implicit that a step must follow or precede another step. Any feature of any of the embodiments disclosed herein may be applied to any other embodiment, wherever appropriate. Likewise, any advantage of any of the embodiments may apply to any other embodiments, and vice versa. Other objectives, features and advantages of the enclosed embodiments will be apparent from the description.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. An amplifier circuit, comprising:
    at least a first RF amplifier circuit having source, gate, and drain terminals, the source terminal connected to RF signal ground;
    a first RF input connector electrically coupled to the gate terminal of the first amplifier circuit;
    a first RF output connector electrically coupled to the drain terminal of the first amplifier circuit;
    at least one of
       a first input impedance matching network electrically coupled to the gate terminal of the first amplifier circuit, and
       a first output impedance matching network electrically coupled to the drain terminal of the first amplifier circuit;
    wherein at least one first impedance matching network comprises a multi-stage decoupling network comprising two or more decoupling stages, each decoupling stage of the multi-stage decoupling network comprising a resistance $R_{DSx}$ connected in series with an inductance $L_{DSx}$, the series $R_{DSx}$ and $L_{DSx}$ connection further connected to a capacitance $C_{DSx}$ which is connected to signal ground, and configured to reduce impedance at a different frequency below an operating band of the amplifier circuit.

2. The amplifier circuit of claim 1 wherein the operating band of the amplifier circuit is in the R-band.

3. The amplifier circuit of claim 1 wherein the operating band of the amplifier circuit is in the S-band.

4. The amplifier circuit of claim 1 wherein the operating band of the amplifier circuit is in the X-band.

5. The amplifier circuit of claim 1 wherein the operating band of the amplifier circuit is in the Ku-band.

6. The amplifier circuit of claim 1 wherein the operating band of the amplifier circuit is in the K-band.

7. The amplifier circuit of claim 1 wherein the operating band of the amplifier circuit is in the Ka-band.

8. The amplifier circuit of claim 1 wherein the operating band of the amplifier circuit is in the V-band.

9. The amplifier circuit of claim 1 wherein each of the two or more decoupling stages comprises a resistance, inductance, and capacitance, and is configured to resonate at a characteristic frequency below the amplifier circuit operating band.

10. The amplifier of claim 9 wherein the multi-stage decoupling network is configured to reduce impedance across a range of frequencies, below the operating band of the amplifier circuit, that is wider than the resonant frequency range of any one of the two or more decoupling stages.

11. The amplifier of claim 1 wherein a first decoupling stage is configured to reduce impedance at frequencies in the range of about 100 MHz to about 300 MHz.

12. The amplifier of claim 1 wherein a second decoupling stage is configured to reduce impedance at frequencies in the range of about 1 MHz to about 30 MHz.

13. The amplifier of claim 1 wherein a third decoupling stage is configured to reduce impedance at frequencies in the range of about 100 KHz to about 900 KHz.

14. The amplifier circuit of claim 10 wherein each decoupling stage comprises a resistance and inductance connected in series, with a shunt capacitance, and wherein each decoupling stage is connected in series configuration in the multi-stage decoupling network.

15. The amplifier circuit of claim 10 wherein each decoupling stage comprises a resistance, inductance, and capacitance connected in series, and wherein each decoupling stage is connected in shunt configuration in the decoupling network.

16. The amplifier circuit of claim 1 comprising both the first input impedance matching network comprising a multi-stage decoupling network and the first output impedance matching network comprising a multi-stage decoupling network.

17. The amplifier circuit of claim 1 comprising both the first input impedance matching network and the first output impedance matching network, and wherein only one of the first input and first output impedance matching networks comprise a multi-stage decoupling network.

18. The amplifier circuit of claim 1 further comprising at least one of:
    a first gate bias voltage connector electrically coupled to the gate terminal of the first amplifier circuit; and
    a first drain bias voltage connector electrically coupled to the drain terminal of the first amplifier circuit.

19. The amplifier circuit of claim 18 wherein a bias voltage connector electrically coupled to a terminal of the first amplifier circuit having an impedance matching network including a multi-stage decoupling network, is coupled between the impedance matching network and the multi-stage decoupling network.

20. The amplifier circuit of claim 18 wherein a bias voltage electrically connector coupled to a terminal of the first amplifier circuit having an impedance matching network including a multi-stage decoupling network, is coupled such that the impedance matching network and at least one decoupling stage are interposed between the amplifier circuit terminal and the bias voltage connector.

21. The amplifier circuit of claim 18 further comprising:
a second RF amplifier circuit having source, gate, and drain terminals, the source terminal electrically coupled to RF signal ground;
a second RF input connector electrically coupled to the gate terminal of the second amplifier circuit; and
a second RF output connector electrically coupled to the drain terminal of the second amplifier circuit.

22. The amplifier circuit of claim 21 wherein the first and second RF amplifiers are configured as a Doherty amplifier.

23. The amplifier circuit of claim 21 further comprising at least one of:
a second input impedance matching network electrically coupled to the gate terminal of the second amplifier circuit, and
a second output impedance matching network electrically coupled to the drain terminal of the second amplifier circuit;
wherein at least one second impedance matching network comprises a multi-stage decoupling network, each decoupling stage of the decoupling network configured to reduce impedance at a different frequency below an operating band of the amplifier circuit.

24. The amplifier circuit of claim 23 comprising both the second input impedance matching network and the second output impedance matching network.

25. The amplifier circuit of claim 21 wherein one or both of:
the first gate bias voltage connector is further coupled to the gate terminal of the second amplifier circuit; and
a first drain bias voltage connector is further coupled to the drain terminal of the second amplifier circuit.

26. The amplifier circuit of claim 21 further comprising at least one of:
a second gate bias voltage connector coupled to the gate terminal of the second amplifier circuit; and
a second drain bias voltage connector coupled to the drain terminal of the second amplifier circuit.

27. A method of manufacturing an amplifier circuit, comprising:
providing at least a first RF amplifier circuit having source, gate, and drain terminals, and electrically coupling the source terminal to RF signal ground;
electrically coupling a first RF input connector to the gate terminal of the first amplifier circuit;
electrically coupling a first RF output connector to the drain terminal of the first amplifier circuit;
electrically coupling at least one of
a first input impedance matching network to the gate terminal of the first amplifier circuit, and
a first output impedance matching network to the drain terminal of the first amplifier circuit;
wherein at least one first impedance matching network comprises a multi-stage decoupling network comprising two or more decoupling stages, each stage of the multi-stage decoupling network comprising a resistance $R_{DSx}$ connected in series with an inductance $L_{DSx}$, the series $R_{DSx}$ and $L_{DSx}$ connection further connected to a capacitance $C_{DSx}$ which is connected to signal ground, and configured to reduce impedance at a different frequency below an operating band of the amplifier circuit.

28. The method of claim 27 wherein the operating band of the amplifier circuit is in one of the R-Band, S-Bank, X-Band, Ku-Band, K-Band, Ka-Band, and V-Band.

29. The method of claim 27 wherein a first decoupling stage is configured to reduce impedance at frequencies in the range of about 100 MHz to about 300 MHz.

30. The method of claim 27 wherein a second decoupling stage is configured to reduce impedance at frequencies in the range of about 1 MHz to about 30 MHz.

31. The method of claim 27 wherein a third decoupling stage is configured to reduce impedance at frequencies in the range of about 100 KHz to about 900 KHz.

32. The method of claim 27 wherein each decoupling stage comprises a resistance, inductance, and capacitance, and further comprising selecting component values for the resistance, inductance, and capacitance such that the decoupling stage resonates at a characteristic frequency below the amplifier circuit operating band.

33. The method of claim 32 wherein the multi-stage decoupling network is configured to reduce impedance across a range of frequencies, below the operating band of the amplifier circuit, that is wider than the resonant frequency range of any one of the two or more decoupling stages.

34. The method of claim 33 wherein each decoupling stage comprises a resistance and inductance connected in series, with a shunt capacitance, and wherein electrically coupling the first impedance matching network comprises coupling each decoupling stage in series configuration in the multi-stage decoupling network.

35. The method of claim 33 wherein each decoupling stage comprises a resistance, inductance, and capacitance connected in series, and wherein electrically coupling the first impedance matching network comprises coupling each decoupling stage in shunt configuration in the decoupling network.

36. The method of claim 27 wherein electrically coupling at least one of a first input and output impedance matching circuit comprises electrically coupling both the first input impedance matching network comprising a multi-stage decoupling network and the first output impedance matching network comprising a multi-stage decoupling network.

37. The method of claim 27 wherein electrically coupling at least one of a first input and output impedance matching circuit comprises electrically coupling both the first input impedance matching network and the first output impedance matching network, and wherein only one of the first input and output impedance matching networks comprises a multi-stage decoupling network.

38. The method of claim 27 further comprising electrically coupling at least one of:
a first gate bias voltage connector to the gate terminal of the first amplifier circuit; and
a first drain bias voltage connector to the drain terminal of the first amplifier circuit.

39. The method of claim 38 wherein electrically coupling a bias voltage connector to a terminal of the first amplifier circuit having an impedance matching network including a multi-stage decoupling network, comprises coupling the bias voltage connector between the impedance matching network and the multi-stage decoupling network.

40. The method of claim 38 wherein coupling a bias voltage connector to a terminal of the first amplifier circuit having an impedance matching network including a multi-stage decoupling network, comprises coupling the bias voltage connector such that the impedance matching network and at least one decoupling stage are interposed between the amplifier circuit terminal and the bias voltage connector.

41. The method of claim 38 further comprising:
- providing a second RF amplifier circuit having source, gate, and drain terminals, and electrically coupling the source terminal to RF signal ground;
- electrically coupling a second RF input connector to the gate terminal of the second amplifier circuit; and
- electrically coupling a second RF output connector to the drain terminal of the second amplifier circuit.

42. The method of claim 41 wherein the first and second RF amplifiers are configured as a Doherty amplifier.

43. The method of claim 41 further comprising electrically coupling at least one of:
- a second input impedance matching network to the gate terminal of the second amplifier circuit, and
- a second output impedance matching network to the drain terminal of the second amplifier circuit;
- wherein at least one second impedance matching network comprises a multi-stage decoupling network, each decoupling stage of the decoupling network configured to reduce impedance at a different frequency below an operating band of the amplifier circuit.

44. The method of claim 43 wherein electrically coupling at least one of a second input and output impedance matching circuit comprises electrically coupling both the second input and output impedance matching networks.

45. The method of claim 43 further comprising electrically coupling at least one of:
- a second gate bias voltage connector to the gate terminal of the second amplifier circuit; and
- a second drain bias voltage connector to the drain terminal of the second amplifier circuit.

* * * * *